United States Patent
Tamaki

(10) Patent No.: US 7,705,697 B2
(45) Date of Patent: *Apr. 27, 2010

(54) WAVEGUIDE COUPLER

(75) Inventor: Tsutomu Tamaki, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/637,713

(22) Filed: Dec. 13, 2006

(65) Prior Publication Data

US 2007/0085636 A1 Apr. 19, 2007

Related U.S. Application Data

(63) Continuation of application No. 10/994,678, filed on Nov. 23, 2004, now Pat. No. 7,190,243, which is a continuation of application No. 09/963,466, filed on Sep. 27, 2001, now abandoned.

(30) Foreign Application Priority Data

Oct. 6, 2000 (JP) ............................. 2000-307422
Jul. 19, 2001 (JP) ............................. 2001-220496

(51) Int. Cl.
*H01P 5/02* (2006.01)
(52) U.S. Cl. ....................... 333/254; 333/260
(58) Field of Classification Search ................ 333/254, 333/260, 246
See application file for complete search history.

(56) References Cited

U.S. PATENT DOCUMENTS

| 4,562,416 | A | 12/1985 | Sedivec |
| 5,471,181 | A | 11/1995 | Park |
| 5,552,752 | A | 9/1996 | Sturdivant et al. |
| 5,668,509 | A | 9/1997 | Hoffmeister et al. |
| 5,929,728 | A | 7/1999 | Barnett et al. |
| 6,005,458 | A | 12/1999 | Buer et al. |
| 6,400,241 | B1 | 6/2002 | Ulian et al. |
| 6,515,562 | B1 | 2/2003 | Takenoshita et al. |
| 7,190,243 | B2 * | 3/2007 | Tamaki ....................... 333/254 |
| 7,538,642 | B2 * | 5/2009 | Tamaki ....................... 333/254 |

FOREIGN PATENT DOCUMENTS

| EP | 0 249 310 | 12/1987 |
| EP | 0 788 183 | 8/1997 |
| JP | 60-62702 | 4/1985 |
| JP | 6-303001 | 10/1994 |

(Continued)

OTHER PUBLICATIONS

U.S. Patent Office Action dated May 30, 2007.

*Primary Examiner*—Benny Lee
(74) *Attorney, Agent, or Firm*—Buchanan Ingersoll & Rooney PC

(57) ABSTRACT

Conventionally, waveguide terminals formed in a plurality of dielectric substrates are joined together by mounting the dielectric substrates on carriers and fastening them to a waveguide adapter with screws. In the present invention, to reduce cost and improve machinability, a plurality of solders 7 are disposed around the waveguide terminal 2b formed in one dielectric substrate 1b, and the other dielectric substrate 1a having the waveguide terminal 2a is placed across the solders 7 to thereby connect the waveguide terminals by soldering.

5 Claims, 22 Drawing Sheets

FOREIGN PATENT DOCUMENTS

| | | |
|---|---|---|
| JP | 11-112209 | 4/1999 |
| JP | 11-136009 | 5/1999 |
| JP | 11-340701 | 12/1999 |
| JP | 2000-196301 | 7/2000 |
| JP | 2000-269405 A | 9/2000 |
| JP | 2005-045836 | 2/2005 |
| JP | 3763361 | 4/2006 |

* cited by examiner

1/4 OF WAVELENGTH
±30%

WAVEGUIDE COUPLER

This application is a continuation application of application Ser. No. 10/994,678, filed Nov. 23, 2004, now U.S. Pat. No. 7,190,243 which in turn is a continuation application of application Ser. No. 09/963,466, filed Sep. 27, 2001 now abandoned.

BACKGROUND OF THE INVENTION

1. Field of the Invention

The present invention relates to a waveguide coupler of waveguide terminals formed in dielectric substrates used in conjunction with a high frequency band, such as microwave or millimeter-wave band.

2. Description of the Related Art

FIG. 1 is an exploded perspective view showing a configuration for coupling waveguide terminals formed in dielectric substrates by a conventional waveguide coupler. FIG. 2 is a side view when the waveguide terminals are joined together by a conventional waveguide coupler. In FIGS. 1 and 2, 1a and 1b indicate dielectric substrates, 2a, 2b (see FIG. 2), 2c, 2d, and 2e (see FIG. 2) indicate waveguide terminals, 3a and 3b indicate carriers, 4 indicates a waveguide adapter, 5 indicates a screw hole formed in the waveguide adapter, and 6 (see FIG. 2) indicates a screw.

An example of such a conventional waveguide coupler will be described. In FIGS. 1 and 2, the dielectric substrates 1a and 1b having the waveguide terminals 2a and 2e formed therein are bonded to the carriers 3a and 3b, respectively, having the waveguide terminals 2b and 2d with an adhesive or by soldering or brazing. The two dielectric substrates bonded to the carriers are aligned with the waveguide adapter 4 so that the positions of the waveguide terminals 2b, 2c, and 2d coincide with each other, and then fastened at the screw holes 5 with the screws 6. Thus, the conventional dielectric substrates having the waveguide terminals formed therein are connected together with screws via carriers, a waveguide adapter, and so on.

A transmitter-receiver circuit, for example, is provided on the dielectric substrates 1a, 1b, for converting high frequency radio waves transmitted through a waveguide to electrical signals transmitting through a conductor, and vice versa. The transmitter circuit generates a high frequency signal in response to a signal entered externally to the dielectric substrate and supplies it to the carriers 3a, 3b side from the waveguide terminals 2a, 2e. On the other hand, the receiver circuit converts the high frequency signal entered from the carriers 3a, 3b side to the waveguide terminals 2a, 2b to an electrical signal and supplies it externally, for example.

As described above, because conventional waveguide couplers use expensive carriers and waveguide adapter and are fastened with screws, efforts to reduce their cost have failed, and they continue to suffer from degraded machinability. Moreover, because the carriers and the waveguide adapter generally have different coefficients of thermal expansion, when the dielectric substrates are connected and fixed on the carriers and the waveguide adapter using an adhesive, there is a risk of ablation of the adhesive surface or fracture of associated members. Further, the wiring for input/output of electrical signals to/from the circuit on the dielectric substrate is formed by connecting wire materials onto the top surface of the dielectric substrate by bonding, for example, which complicates the manufacturing process.

SUMMARY OF THE INVENTION

The present invention is made to solve the above problems. Therefore, an object of the present invention is to provide a waveguide coupler which is capable of simplifying the process, such as the process of connecting-waveguide terminals of dielectric substrates having a high frequency circuit formed thereon, while reducing the cost of the waveguide coupler.

In a first aspect of the present invention, a waveguide coupler for connecting between rectangular waveguide terminals formed in two dielectric substrates arranged opposite to each other is provided. Each dielectric substrate includes a contact region which conducts electricity to a grounded conductor of the waveguide terminal. One contact region is arranged to surround the waveguide terminal at a position opposite to the other contact region when both waveguide terminals are connected together. Both dielectric substrates are joined with an electrically conductive joint member disposed between the opposing contact regions.

With the present invention, the process of connecting between the waveguide terminals, which has conventionally been manually fastened with screws, can be simplified. Moreover, it is possible to reduce the cost of the coupler, because there is no need to use expensive parts, such as a waveguide adapter and carriers.

In a second aspect of the present invention, a plurality of electrically conductive joint members are arranged to surround a waveguide terminal of an individual dielectric substrate. Both dielectric substrates are joined by the multiple conductive joint members which are sandwiched between the waveguide terminals of both dielectric substrates. This prevents the degradation of the transfer characteristic of high frequency waves at the waveguide coupler, absorbs a difference between, for example, the coefficients of thermal expansion of both dielectric substrates. Moreover, because stress in the first dielectric substrate as a result of distortion due to thermal expansion or the like of the second dielectric substrate is unlikely to result, resulting cracks or other failures or defects in the first dielectric substrate can be prevented.

DESCRIPTION OF THE PREFERRED EMBODIMENTS

Embodiment 1

Figure 1:
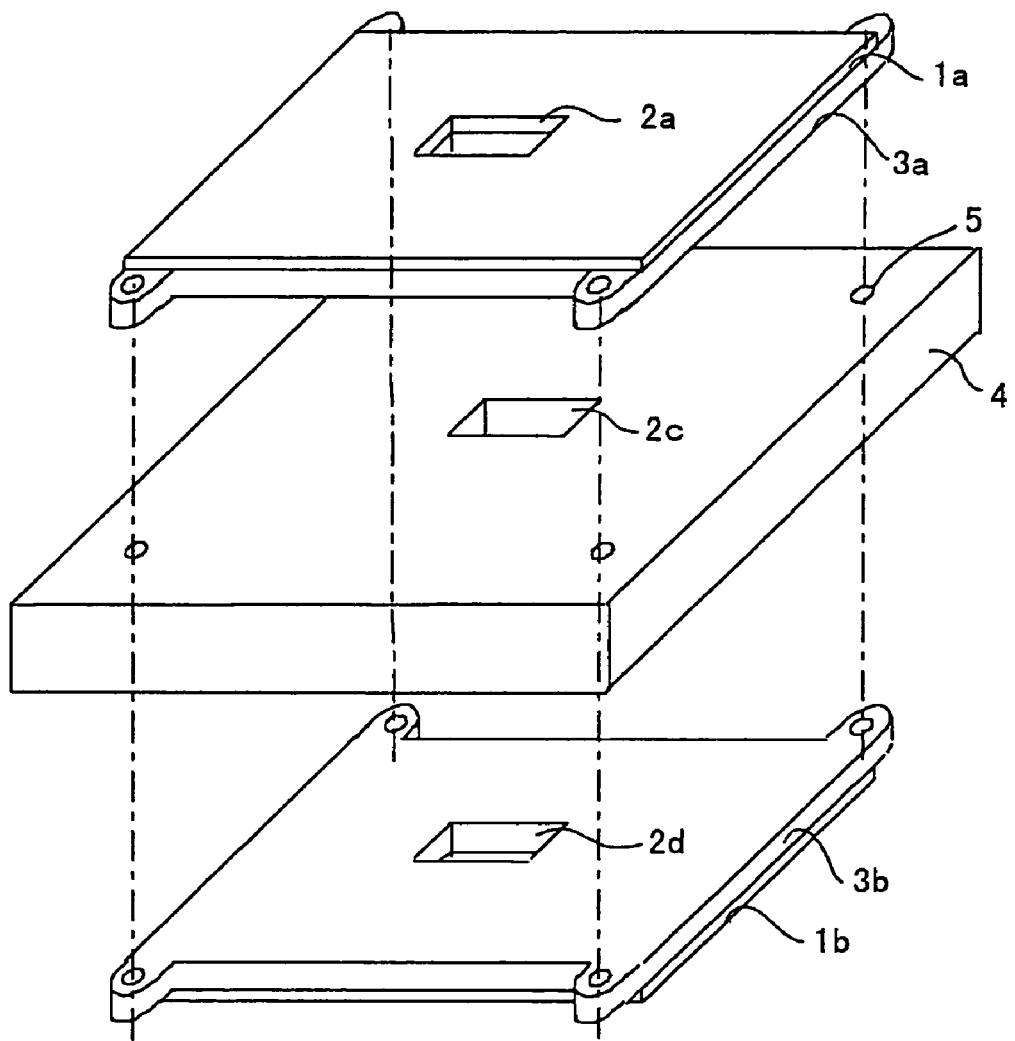
FIG. 1 is an exploded perspective view of a conventional waveguide coupler.
Figure 2:
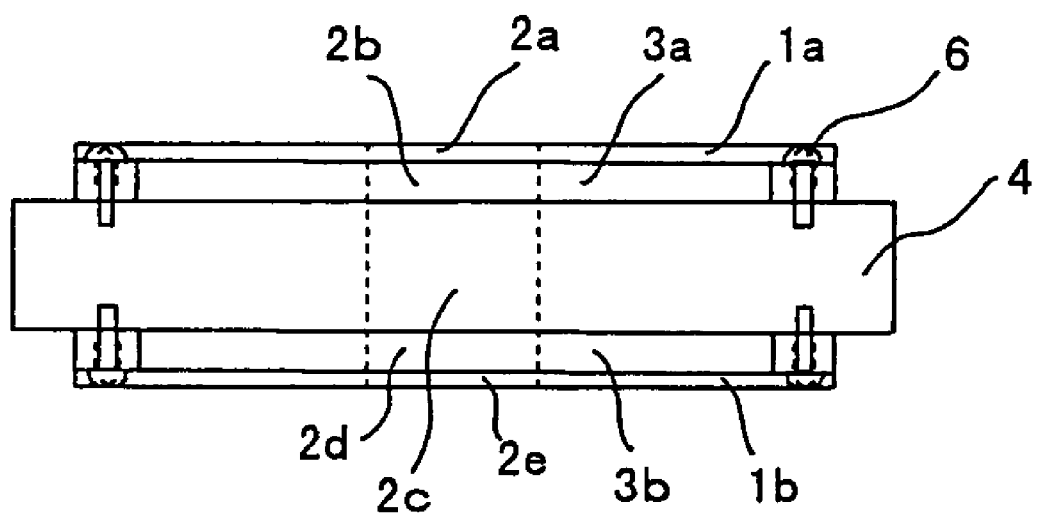
FIG. 2 is a vertical section of the conventional waveguide coupler.
Figure 3A:
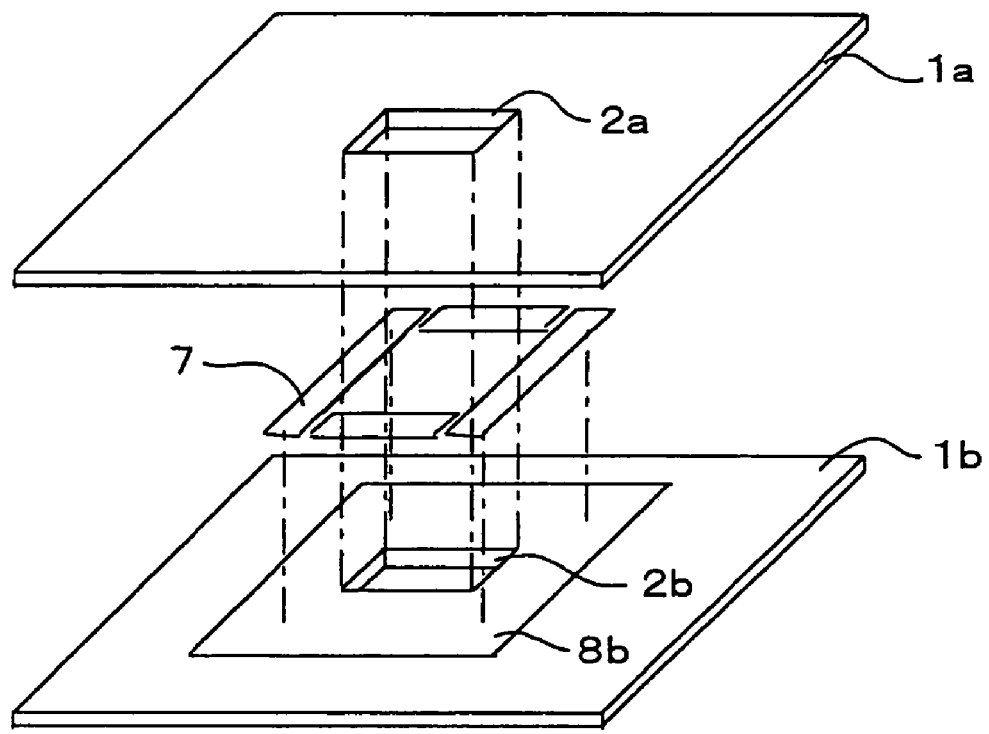
FIG. 3A is an exploded perspective view of a waveguide coupler according to an Embodiment 1.
Figure 3B:
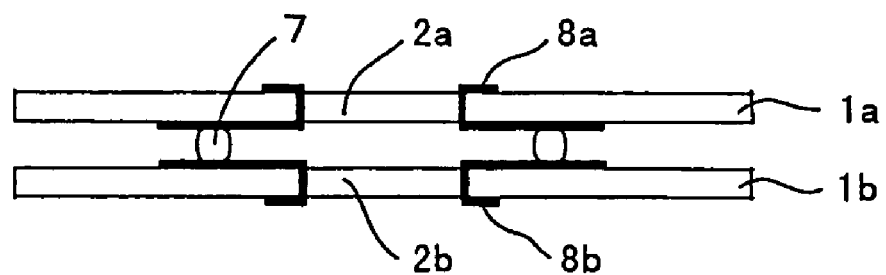
FIG. 3B is a vertical section of the waveguide coupler according to Embodiment 1.

FIG. 3A is an exploded perspective view of a waveguide coupler showing a first embodiment of the present invention. FIG. 3B is a sectional view of the waveguide coupler. In these figures, $1a$ and $1b$ indicate dielectric substrates, $2a$ and $2b$ indicate waveguide terminals formed in the dielectric substrates, 7 indicates solder serving as an electrically conductive joint member, and $8a$ (FIG. 30) and $8b$ indicate grounded conductive surfaces (hereinafter GND), each disposed on the surface of the individual substrate for conducting electricity to the grounded conductor of respective waveguide terminal.

The connection of the waveguide terminals will be described. In the figures, each dielectric substrate $1a$, $1b$ includes the waveguide terminal $2a$, $2b$ formed in each substrate, and the GND surface $8a$ (FIG. 3B), $8b$ disposed on the surface of the substrate for conducting electricity to the grounded conductor of the waveguide terminal $2a$, $2b$. The two dielectric substrates $1a$ and $1b$ are arranged so that the GND surfaces $8a$ and $8b$ oppose each other. The solder 7 is disposed between and in contact with the GND surfaces $8a$ and $8b$, so as to surround the circumference of the waveguide terminals $2a$ and $2b$. Thus, the two dielectric substrates $1a$ and $1b$ are soldered to connect between the waveguide terminals.

Forming the dielectric substrates $1a$ and $1b$ shown in FIGS. 3A and 3B by multi-layered dielectric substrates can provide a similar configuration.

By connecting between the waveguide terminals formed in the dielectric substrates by soldering, it is possible to simplify the connecting process of the waveguide terminals which has conventionally been fastened manually with screws. It is also possible to reduce the cost, because there is no need to use expensive parts, such as a waveguide adapter and carriers.

Embodiment 2

Figure 4:
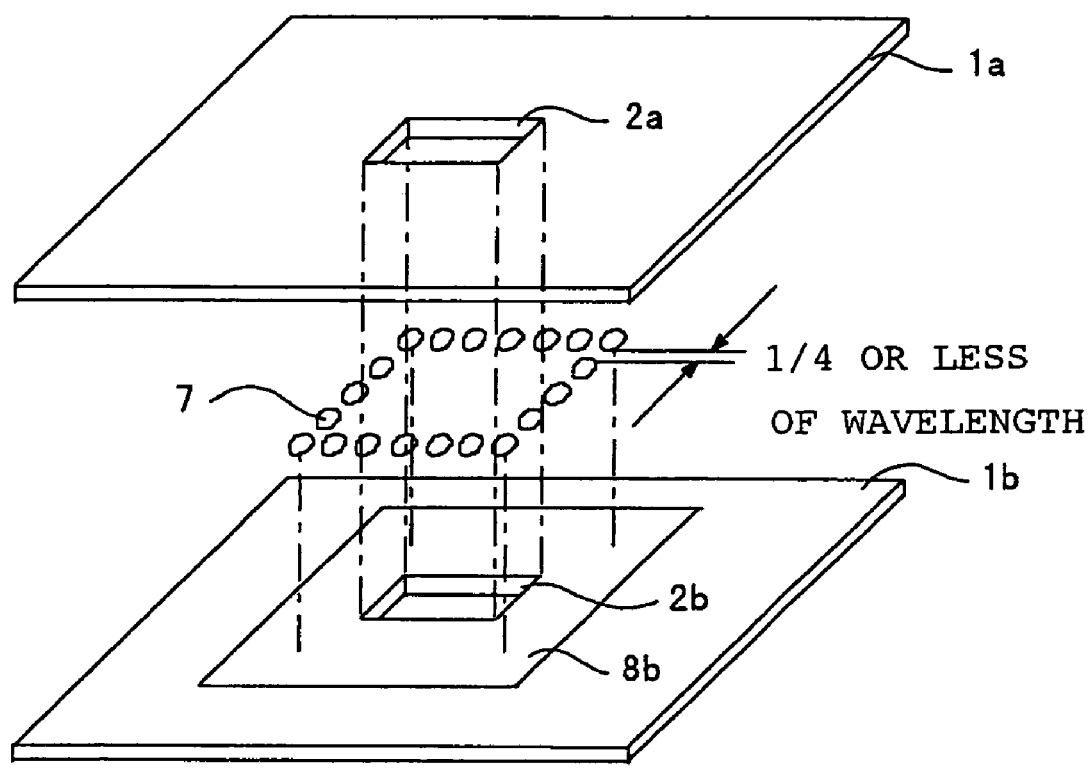
FIG. 4 is an exploded perspective view of a waveguide coupler according to an Embodiment 2.
Figure 5A:
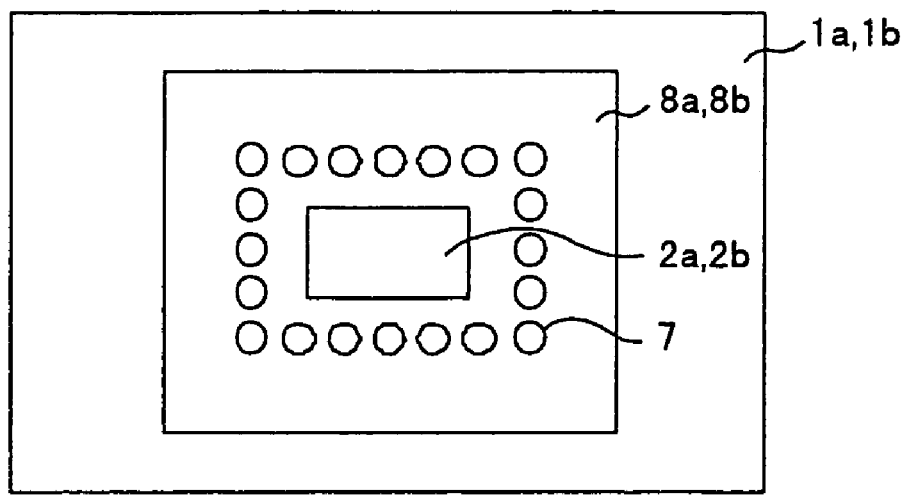
FIG. 5A is a top view of a dielectric substrate which forms a waveguide coupler according to Embodiment 2, wherein a rectangular hole is formed as a waveguide terminal.
Figure 5B:
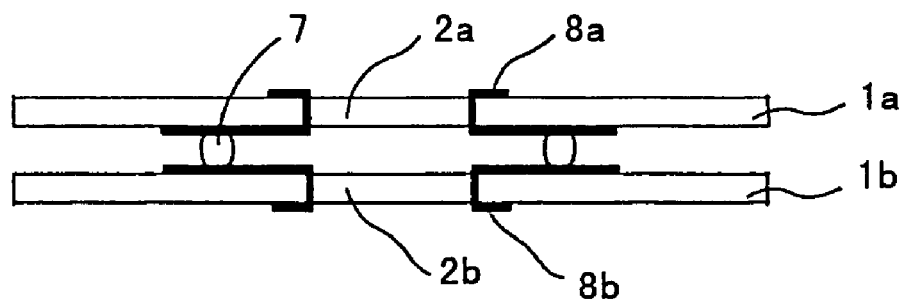
FIG. 5B is a vertical section of the waveguide coupler using the dielectric substrate shown in FIG. 5A.
Figure 6A:
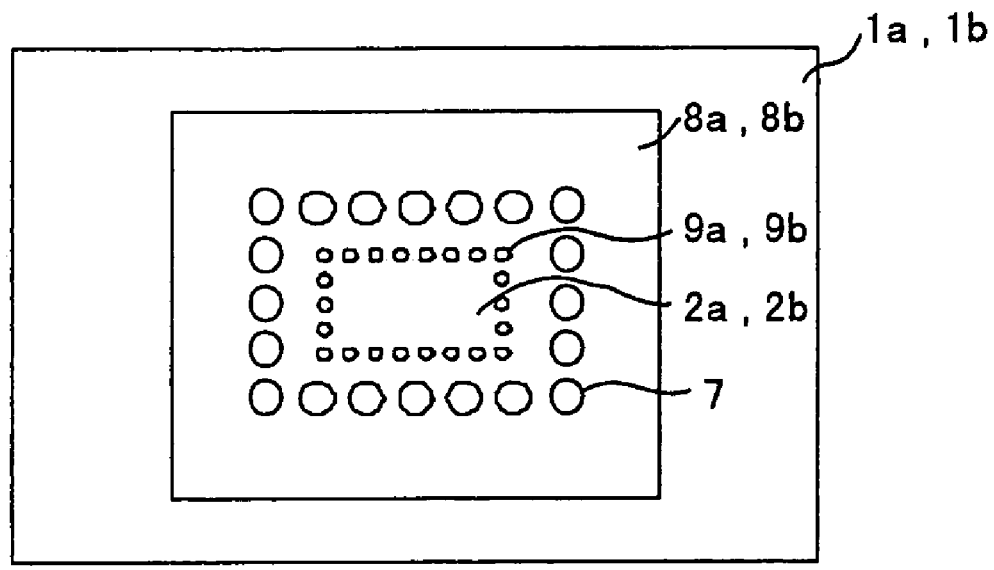
FIG. 6A is a top view of a dielectric substrate which forms another waveguide coupler according to Embodiment 2, wherein a waveguide terminal is formed by providing through holes in a rectangular shape.
Figure 6B:
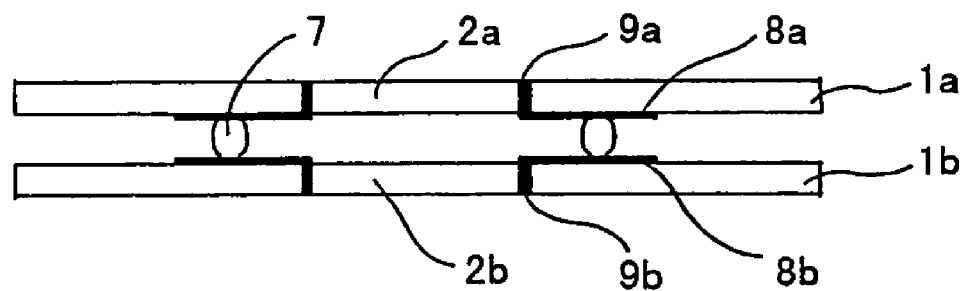
FIG. 6B is a vertical section of the waveguide coupler using the dielectric substrate shown in FIG. 6A.

FIG. 4 is an exploded perspective view of a waveguide coupler showing a second embodiment of the present invention. FIG. 5A is a top view of the dielectric substrate which forms the waveguide coupler of the this embodiment, wherein a rectangular hole is formed in the dielectric substrate as a waveguide terminal. FIG. 5B is a vertical sectional view of the waveguide coupler formed by using the dielectric substrate shown in FIG. 5A. FIG. 6A is a top view of another example of the dielectric substrate which forms the waveguide coupler of this embodiment, wherein the waveguide terminal is formed by through holes arranged in a rectangular shape. FIG. 6B is a vertical sectional view of the waveguide coupler formed by using the dielectric substrate shown in FIG. 6A. In FIGS. 4, 5A, 5B, 6A, 6B, $1a$, $1b$, $2a$, $2b$, $8a$, and $8b$ indicate the elements similar to those shown in Embodiment 1, while 7 indicates a ball-shaped, barrel-shaped or cylindrical solder, and $9a$ and $9b$ indicate through holes (FIGS. 6A, 6B).

The connection of the waveguide terminals will be described. In the figures, the dielectric substrates $1a$ and $1b$, the waveguide terminals $2a$ and $2b$, and the GND surfaces $8a$ and $8b$ are arranged similarly to those of Embodiment 1 and have similar functions. It should be noted that the GND surface $8a$, although not shown in FIG. 4, is disposed on the side of the dielectric substrate $1a$ facing the dielectric substrate $1b$. A plurality of ball-shaped, barrel-shaped, or cylindrical solders 7 are arranged between and in contact with the GND surfaces 8a and 8b, so as to surround the circumference of the waveguide terminals 2a and 2b. The ball-shaped, barrel-shaped, or cylindrical solders 7 are arranged in a row so that a gap between adjacent solders 7 is less than ¼ of the wavelength of a high frequency signal which passes through the waveguide terminals 2a and 2b as shown in FIG. 4. In this way, the two dielectric substrates 1a and 1b, and the ball-shaped, barrel-shaped, or cylindrical solders 7 are arranged so that waveguide terminals 2a and 2b formed in the dielectric substrates 1a and 1b are connected by soldering.

FIG. 5A is a top view of the dielectric substrate of the waveguide coupler described in connection with FIG. 4. In the configuration shown in FIG. 5A, each dielectric substrate 1a, 1b includes the waveguide terminal 2a, 2b formed in each substrate, and the GND surface 8a, 8b disposed on the surface of the substrate for conducting electricity to the grounded conductor of the waveguide terminal 2a, 2b. A plurality of ball-shaped, barrel-shaped, or cylindrical solders 7 are arranged in a row on the GND surfaces 8a and 8b of the dielectric substrates 1a and 1b, respectively, around the waveguide terminals 2a and 2b. In this case, a gap between adjacent ball-shaped, barrel-shaped, or cylindrical solders 7 is less than ¼ of the wavelength of a high frequency signal which passes through the waveguide terminals 2a and 2b, as described above in FIG. 4 The waveguide terminals 2a and 2b can also be formed by arranging the through holes 9a, 9b in a rectangular shape, as in the dielectric substrates 1a and 1b shown in FIG. 6A, and disposing the GND surfaces 8a, 8b so as to conduct electricity to the through holes 9a, 9b, in order to provide a waveguide coupler similar to that of FIG. 4.

Moreover, the waveguide coupler similar to that of FIG. 4 can also be provided by forming the dielectric substrates 1a and 1b shown in FIGS. 5A, 5B, 6A, and 6B by multi-layered substrates.

By connecting between the waveguide terminals formed in the dielectric substrate by soldering, it is possible to simplify the connecting process of the waveguide terminals which has conventionally been fastened manually with screws. It is also possible to reduce the cost, because there is no need to use expensive parts, such as a waveguide adapter or carriers.

Figure 7:
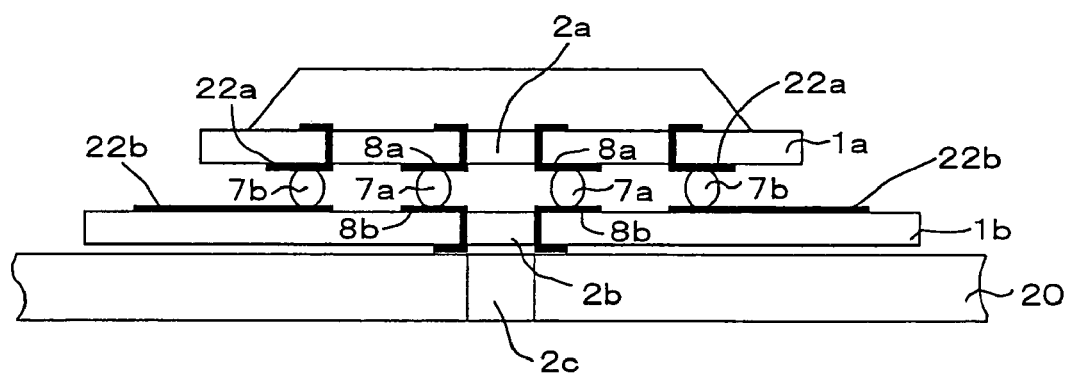
FIG. 7 is a vertical section of a model of a high frequency device using the waveguide coupler according to the present invention.

FIG. 7 is a vertical section of a model of a high frequency device which uses the waveguide coupler according to the present invention. The architecture of the device is such that the waveguide coupler of the above embodiment having the dielectric substrates 1a, 1b is fixed inside a container 20. A high frequency circuit operable in the millimeter-wave band is mounted on the top surface of the dielectric substrate 1a. The GND surface 8a of the waveguide terminal 2a of the dielectric substrate 1a is bonded by solder 7a to the GND surface 8b of the waveguide terminal 2b of the dielectric substrate 1b. The solder 7a is arranged to surround the waveguide terminals 2a, 2b, as mentioned above. The container 20 is made of metal and includes the waveguide terminal 2c formed opposite to the waveguide terminal 2b. The dielectric substrate 1b is fixed to the container 20 with an adhesive or screws. Through the layered waveguide terminals 2a, 2b, and 2c of the dielectric substrates 1a, 1b, and the container 20, respectively, high frequencies are input/output between the high frequency circuit on the dielectric substrate 1a and the outside of the container 20.

An electrical signal may be transmitted via a conductor between the high frequency circuit on the dielectric substrate 1a and the external circuit. The signal can be transmitted via an electrode 22a exposed on the back side of the dielectric substrate la via a through hole formed therein, an electrode 22b disposed on the surface of the dielectric substrate 1b, and the solder 7b for connecting between these electrodes 22a, 22b. In this way, there is no need to connect wires to the top surface of the dielectric substrate 1a by bonding or other means. As a result, an electric terminal connecting to the high frequency circuit on the dielectric substrate 1a can be taken out on the dielectric substrate 1b during the process of forming the waveguide coupler by placing the dielectric substrate 1a and 1b in an overlapping manner.

The high frequency circuit mounted on the dielectric substrate 1a is sealed in an airtight manner to prevent degradation of circuit characteristics. A glass epoxy substrate which is generally used for this purpose is not suitable herein, because it absorbs water. Instead, a ceramic-based substrate is used for the dielectric substrate 1a, which is suitable for the airtight sealing without causing the above problem. The container 20 is made of metal, as mentioned above, and generally has a different coefficient of thermal expansion from that of the dielectric substrate 1a. In general, the ceramic-based material forming the dielectric substrate 1a can crack easily. It is, therefore, not desirable for the container 20 to have a coefficient of thermal expansion largely different from that of the dielectric substrate 1a, because of the risk of physical failure, such as cracking, of the dielectric substrate 1a.

To solve this problem, the metallic material forming the container 20 may be selected to have a coefficient of thermal expansion sufficiently similar to that of the ceramic material forming the dielectric substrate 1a. At the same time, the coefficient of thermal expansion of the dielectric substrate 1b disposed between the container 20 and the dielectric substrate 1a is set to assume an intermediate value between the coefficients of the dielectric substrate 1a and the container 20. Specifically, the materials of the dielectric substrate 1a, the dielectric substrate 1b, and the container 20 are selected so that the magnitude of the coefficient of thermal expansion changes in this order. For example, the container 20 made of metal usually exhibits a greater thermal expansion than does the dielectric substrate 1b. In such a device, if the dielectric substrate 1b is attached to one side of the container 20, the thermal expansion of this side of the container 20 is reduced, alleviating the influence of thermal expansion of the container 20 on the dielectric substrate 1a. The dielectric substrates 1a and 1b are connected at point contacts by the solders 7a, 7b, and both the solders 7a, 7b themselves and the soldered connection between the solders 7a, 7b and individual dielectric substrates are relatively elastic. Therefore, different distortions due to thermal expansion of the dielectric substrates 1a and 1b can be absorbed at this part to reduce the stress within the dielectric substrate 1a.

For example, if the dielectric substrate 1a is made of a ceramic-based material, and the container 20 is made of aluminum (Al), the dielectric substrate 1b can be formed by a glass epoxy substrate.

In order to seal the waveguide terminals airtightly as in the above device, it is preferable to use the configuration as shown in FIG. 6A wherein the waveguide terminal 2a is formed by the through holes 9a arranged in a rectangular shape, rather than the configuration of FIG. 5A having the waveguide terminal 2a formed by a large aperture. In the configuration shown in FIG. 6A, the dielectric substrate remains inside the enclosure of the through holes 9a, and the through holes 9a can be closed easily by filling metals. By thus closing the waveguide terminal 2a, it can prevent flow of materials through it, while transmitting high frequency waves.

The above-described second embodiment illustrates one aspect of the present invention, wherein a plurality of electrically conductive joint members are arranged to surround the waveguide terminals of both dielectric substrates, and both dielectric substrates are bonded together by the multiple electrically conductive joint members which are sandwiched between the waveguide terminals of both dielectric substrates. With this configuration, the waveguide coupler can absorb the difference of coefficients, for example, of thermal expansion between both dielectric substrates without causing any damage to the transfer characteristic of high frequency waves. That is, stress is unlikely to result in the first dielectric substrate by distortion due to thermal expansion or the like of the second dielectric substrate, preventing a crack or the like of the first dielectric substrate.

The above-described second embodiment also illustrates another aspect of the present invention, wherein a gap between adjacent electrically conductive joint member is equal to, or less than ¼ of the wavelength of the high frequency signal passing through the waveguide terminal. With this configuration, it is possible to keep a good transfer characteristic of high frequency waves at the waveguide coupler.

Embodiment 3

Figure 8A:
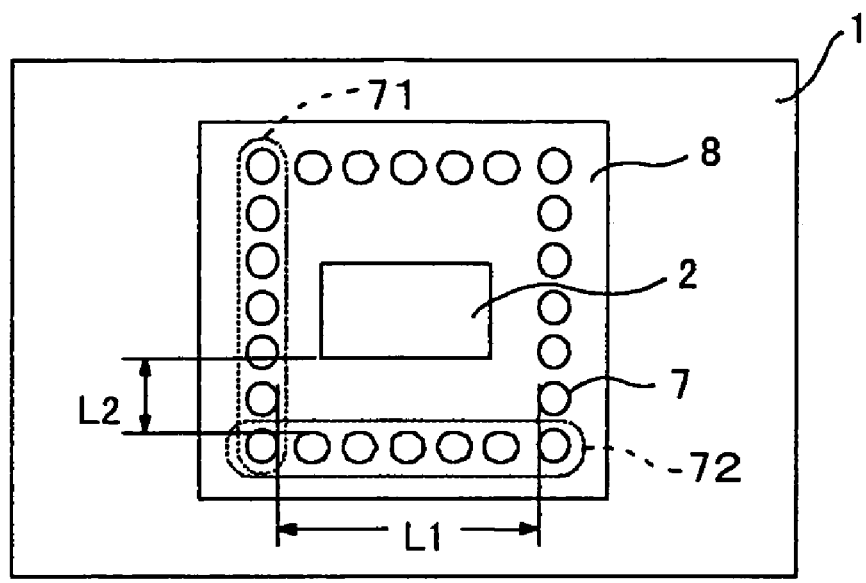
FIG. 8A is a top view of another dielectric substrate which forms a waveguide coupler according to an Embodiment 3, wherein a rectangular hole is formed as a waveguide terminal.
Figure 8B:
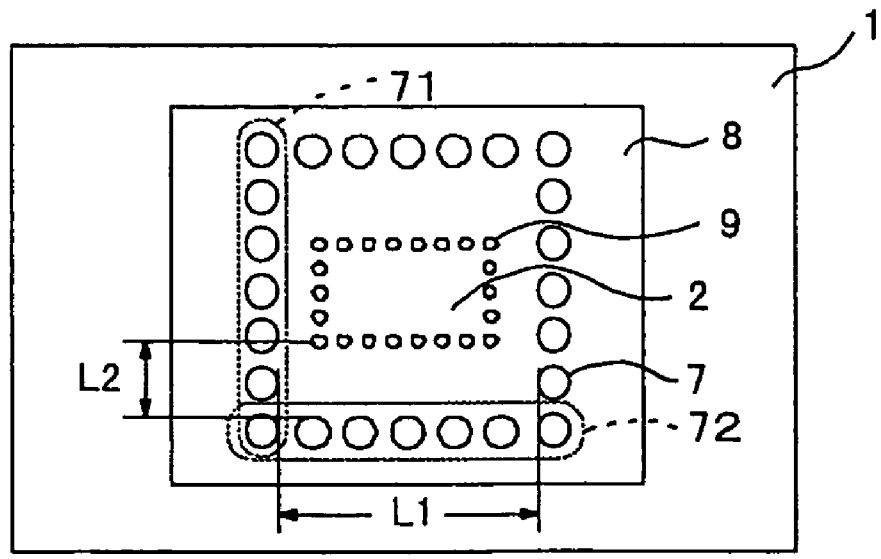
FIG. 8B is a top view of a still another dielectric substrate which forms the waveguide coupler according to Embodiment 3, wherein a waveguide terminal is formed by providing through holes in a rectangular shape.

FIGS. 8A and 8B are top views of a dielectric substrate of a waveguide coupler according to a third embodiment of the present invention. FIG. 8A shows a waveguide terminal formed as a rectangular hole and FIG. 8B shows a waveguide terminal formed by providing through holes 9 in a rectangular shape. In these figures, 1 to 9 indicate elements similar to those of Embodiment 2. 71 indicates a first solder row formed by the ball-shaped, barrel-shaped, or cylindrical solders 7 arranged in a row in parallel with shorter sides of the waveguide terminal 2, and 72 indicates a second solder row formed by the ball-shaped, barrel-shaped, or cylindrical solders 7 arranged in a row in parallel with longer sides of the waveguide terminal 2. The second solder row 72 is arranged at a distance L2 from the waveguide terminal and the distance between first solder row 71 is L1.

Figure 9:
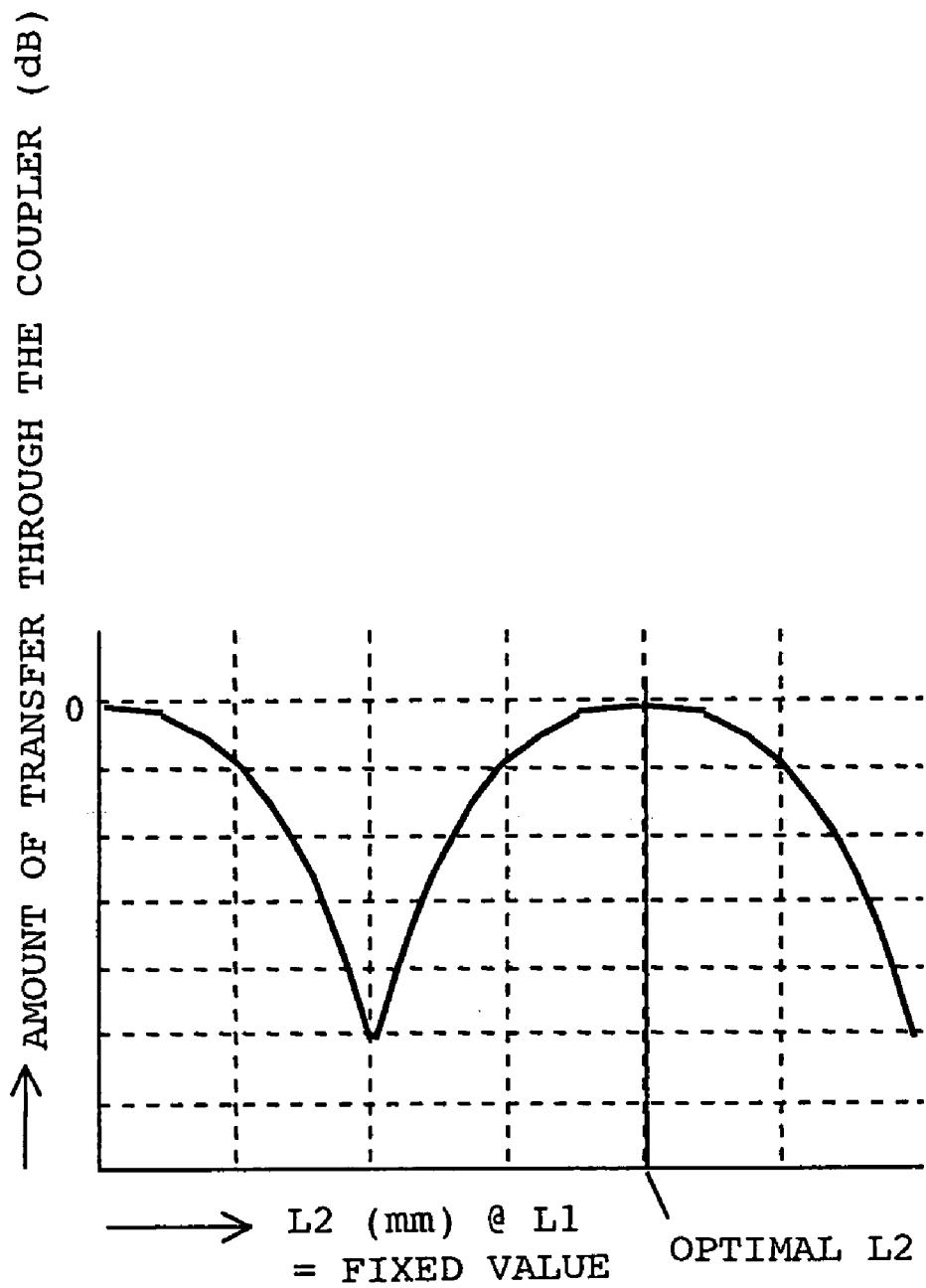
FIG. 9 is a graph showing the characteristic of the waveguide coupler according to Embodiment 3.

FIG. 9 is a graph showing the loss in the waveguide coupler. The graph represents the characteristic of transfer efficiency when L1 is fixed and L2 is changed, where L1 is a distance between the two first solder rows 71 arranged opposite to each other across the waveguide terminal 2, and L2 is a distance from an edge of the waveguide terminal 2 to either one of the two second solder rows 72 arranged opposite to each other across the waveguide terminal 2.

In FIG. 8A, the dielectric substrate 1 includes the waveguide terminal 2 formed therein, and the GND surface 8 disposed on the surface of the substrate for conducting electricity to the grounded conductor of the waveguide terminal 2. The multiple ball-shaped, barrel-shaped, or cylindrical solders 7 are arranged in a row around the waveguide terminal 2 on the GND surface 8 of the dielectric substrate 1. Herein, a gap between adjacent ball-shaped, barrel-shaped, or cylindrical solders 7 is set to be equal to, or less than ¼ of the wavelength of a high frequency signal passing through the waveguide terminal 2. Assuming that L1 is a distance between the two first solder rows 71 arranged opposite to each other across the waveguide terminal 2, and L2 is a distance from an edge of the waveguide terminal 2 to either one of the two second solder rows 72 arranged opposite to each other across the waveguide terminal 2, L1 and L2 are set to have a relationship $\lambda \times (0.7 \text{ to } 1.3) = 2/(1/L1^2 + 1/L2^2)^{1/2}$ with respect to the wavelength $\lambda$ of a high frequency signal passing through the waveguide terminal 2.

The transfer characteristic of the waveguide coupler will be described. As shown in FIG. 9, when the distance L2 is changed with the distance L1 being fixed, the loss in the waveguide coupler changes significantly. The loss is minimized at the optimal L2 indicated in the figure. The optimal L2 of this graph can be determined from the above expression $\lambda \times (0.7 \text{ to } 1.3) = 2/(1/L1^2 + 1/L2^2)^{1/2}$.

By setting L1 and L2 as above, it is possible to minimize the loss (and maximize the amount of transfer) in the waveguide coupler, while simplifying and reducing the cost of the connecting process of the waveguide terminals.

A similar advantage can be provided by forming the waveguide terminal 2 by the through holes 9 arranged in a rectangular shape in the dielectric substrate, and disposing the GND surface 8 so as to conduct electricity to the through holes 9, as shown in FIG. 8B.

Forming the dielectric substrate 1 as shown in FIGS. 8A and 8B by a multi-layered dielectric substrate can also provide a similar advantage.

Although the solders 7 described above are ball-shaped, barrel-shaped, or cylindrical, solders in other shapes, such as a plate, can provide similar advantages.

To summarize, in a further aspect of the present invention, the multiple electrically conductive joint members are arranged in a row on the circumference of a rectangle having four sides, each two sides being in parallel with either longer or shorter sides of the rectangular waveguide terminal. Assuming that L1 is a distance between the first rows of the conductive joint members arranged on opposite two sides of the rectangle running in parallel with the shorter sides of the waveguide terminal, and L2 is a distance between the edge of the waveguide terminal and either one of the second rows of the conductive joint members arranged on opposite two sides of the rectangle running in parallel with the longer sides of the waveguide terminal, L1 and L2 are set to satisfy the relationship $$\lambda \times (0.7 \text{ to } 1.3) = 2/(1/L1^2 + 1/L2^2)^{1/2}$$

where $\lambda$ is the wavelength of a high frequency signal passing through the waveguide terminal. With this configuration, the loss in the waveguide coupler is minimized, as described above.

It is understood from FIG. 9 that the loss in the waveguide coupler becomes minimal at the optimal L2 and also at L2=0. Specifically, to correspond to L2=0, the first solder rows 71 and the second solder rows 72 can be arranged in close proximity to the edge of the waveguide terminal 2 (e.g., L2=0.2 to 0.5 mm), in order to minimize the loss in the waveguide coupler. By arranging the solder rows closer to the edge of the waveguide terminal 2, an area of the dielectric substrates 1a, 1b to be occupied by the waveguide terminals surrounded by the solder rows is decreased. Accordingly, the size of the dielectric substrates 1a, 1b can be decreased, leading to cost reduction. This is particularly advantageous when the dielectric substrate 1a or 1b is formed by a ceramic-based material, because such material is relatively expensive. In practice, when the waveguide coupler formed by the dielectric substrates 1a, 1b is used in a device, stress may result in the dielectric substrates because of the difference of thermal expansion between the substrates and the container or the like to which the substrates are attached. When the thickness of the dielectric substrates is fixed, the dielectric substrates become stronger as the area of the substrates is smaller. Therefore, by using the above-described arrangement of the solder rows to decrease areas of the dielectric substrates, it is possible to prevent cracking of the ceramic substrate as a result of thermal expansion or the like, to thereby improve the reliability of the device.

Thus, in a still further aspect of the present invention, the multiple conductive joint members are arranged in a row on the circumference of a rectangle having four sides, each two sides being in parallel with longer or shorter sides of the rectangular waveguide terminal. Herein, both a distance between the first rows of the conductive joint members arranged on opposite two sides of the rectangle running in parallel with the shorter sides of the waveguide terminal, and a distance between the edge of the waveguide terminal and either one of the second rows of the conductive joint members arranged on opposite two sides of the rectangle running in parallel with the longer sides of the waveguide terminal are set to be equal to, or less than 0.5mm, respectively. This configuration is advantageous in terms of minimizing the loss in the waveguide coupler, for example.

Embodiment 4

Figure 10A:
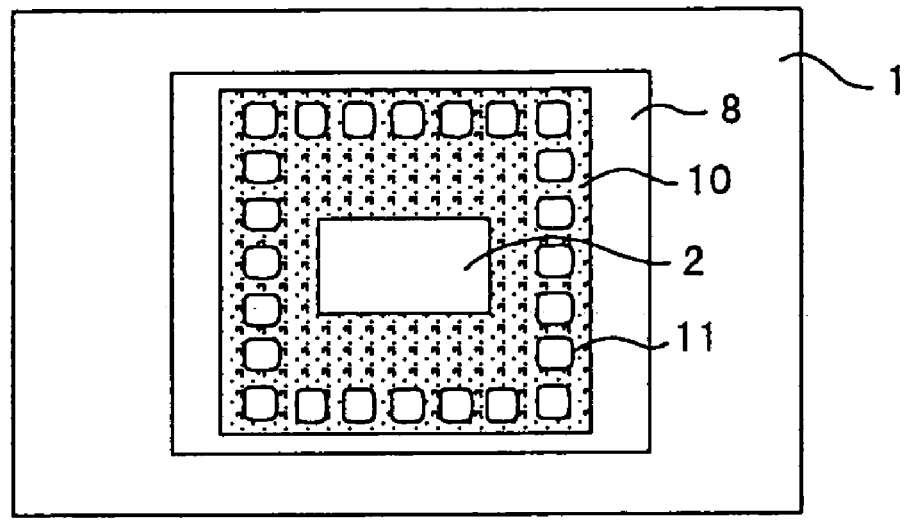
FIG. 10A is a top view of a dielectric substrate according to an Embodiment 4.
Figure 10B:
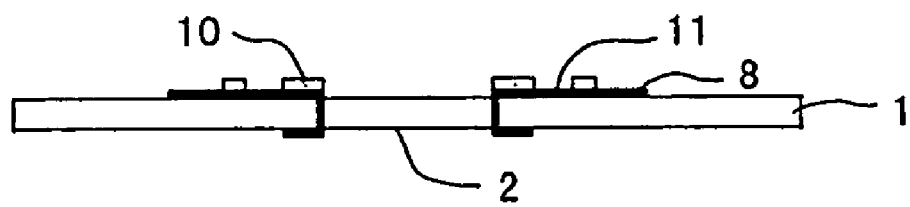
FIG. 10B is a vertical section of a single-layered dielectric substrate according to Embodiment 4.
Figure 10C:
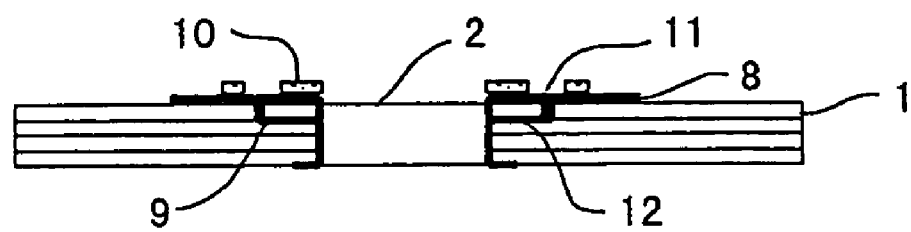
FIG. 10C is a vertical section of a multi-layered dielectric substrate according to Embodiment 4.

FIG. 10A is a top view showing a dielectric substrate of the waveguide coupler according to a fourth embodiment of the present invention. FIGS. 10B and 10C are vertical sections of the dielectric substrate. In these figures, components 1 to 9 are similar to those of Embodiment 3, 10 indicates a solder resist serving as a resist film for joint members, 11 indicates a pad which forms part of the GND surface 8 for disposing the ball-shaped, barrel-shaped, or cylindrical solders 7 thereon, and 12 indicates a GND pattern formed in an internal layer of a multi-layered substrate.

FIG. 10A is a top view of the dielectric substrate 1, FIG. 10B is a vertical section of a single-layered dielectric substrate 1, and FIG. 10C is a vertical section of a multi-layered dielectric substrate 1. In FIGS. 10A and 10B, the dielectric substrate 1 includes the waveguide terminal 2 formed therein, and the GND surface 8 disposed on the surface of the substrate for conducting electricity to the grounded conductor of the waveguide terminal 2. The solder resist 10 is applied on a region of the GND surface 8 other than the regions where the pads 11 used for disposing the ball-shaped, barrel-shaped, or cylindrical solder 7 are to be formed. Then, the pads 11 to which the ball-shaped, barrel-shaped, or cylindrical solder 7 can be attached are formed on this region of the GND surface 8.

FIG. 10C shows the dielectric substrate 1 of FIG. 10A formed by a multi-layered substrate, wherein the GND surface 8 is connected to the grounded conductor of the waveguide terminal 2 via the GND pattern 12 formed in the internal layer of the dielectric substrate 1 and the through hole 9. The solder resist 10 and the pads 11 used for disposing the ball-shaped, barrel-shaped, or cylindrical solders 7 are provided as shown in FIG. 10A.

By providing the pads 11 for the ball-shaped, barrel-shaped, or cylindrical solders 7 using the solder resist 10, it is possible to set the positions of the ball-shaped, barrel-shaped, or cylindrical solders 7 accurately, while simplifying and reducing the cost of the connecting process of the waveguide terminal 2, as in Embodiment 2. It is also possible to minimize the loss in the waveguide coupler by deriving and setting the parameters L1 and L2 concerning the positions of the ball-shaped, barrel-shaped, or cylindrical solders 7, as in Embodiment 3.

A similar advantage can be provided by forming the waveguide terminal by arranging the through holes in a rectangular shape on the dielectric substrate 1, and then disposing the GND surface 8 so as to conduct electricity to the through holes.

Although the solders 7 described above are ball-shaped, barrel-shaped, or cylindrical, solders in other shapes, such as a plate, can provide similar advantages.

If the solder resist 10 is not applied between the solders 7 on the surface of the substrate with only a small gap being provided between individual solders, heat during bonding of the dielectric substrates 1a, 1b, could melt the solder such that it spreads over the surface of the substrate, possibly merging and becoming a mass of solder. In principle, this happens between two adjacent solders 7. Therefore, a gap between the adjacent solders 7 is substantially eliminated, while a gap between the merged solder pair and its adjacent solder 7 becomes larger than a designed value, leaving uneven gaps between solders.

In contrast, when the solder resist 10 is applied between the positions where the solders 7 are to be placed according to this embodiment, the solders 7 can be separated clearly from each other even when only a small gap is provided between adjacent solders 7, thereby making it easy to maintain a constant gap between the solders 7. Specifically, in the waveguide coupler compatible with higher frequencies, it is easy to set the gap between the solders 7 to a certain design value, such as ¼ of the wavelength, to reduce the loss of the high frequency signal.

Thus, the fourth embodiment defines a still further aspect of the present invention, wherein at least one dielectric substrate includes a grounded conductive surface formed on the side of the substrate opposite to the other dielectric substrate for conducting electricity to the grounded conductor of the waveguide terminal, and a resist film for the joint members formed on the grounded conductive surface for preventing attachment of the conductive joint members. In this way, the contact regions are provided in part of the grounded conductive surface, while the resist film for the joint members is formed in a pattern having apertures for the contact regions. By providing the resist film for the joint members on the surface of the grounded conductor of the dielectric substrate so as to expose multiple contact regions on which the conductive joint members are to be placed, it is possible to improve accuracy of positioning of the conductive joint members, especially the accuracy of spacing between adjacent conductive joint members, and thereby reduce loss in the waveguide coupler.

With the above configuration, it is also possible to suppress loss in the waveguide coupler by setting the positional relationship between the waveguide terminal and the solder rows arranged on the circumference of a rectangle, as in the third embodiment described above. For example, if it is desired to position the solder rows and the edge of the waveguide terminal in close proximity to each other, a region covered by the solder resist 10 is provided between the edge of the waveguide terminal and the pads 11. In such a device, although it is not possible to eliminate a space between the solder rows and the waveguide terminal, this distance can be reduced to 0.5 mm or less using various patterning techniques. This facilitates achievement of a preferable transfer characteristic.

Embodiment 5

Figure 11A:
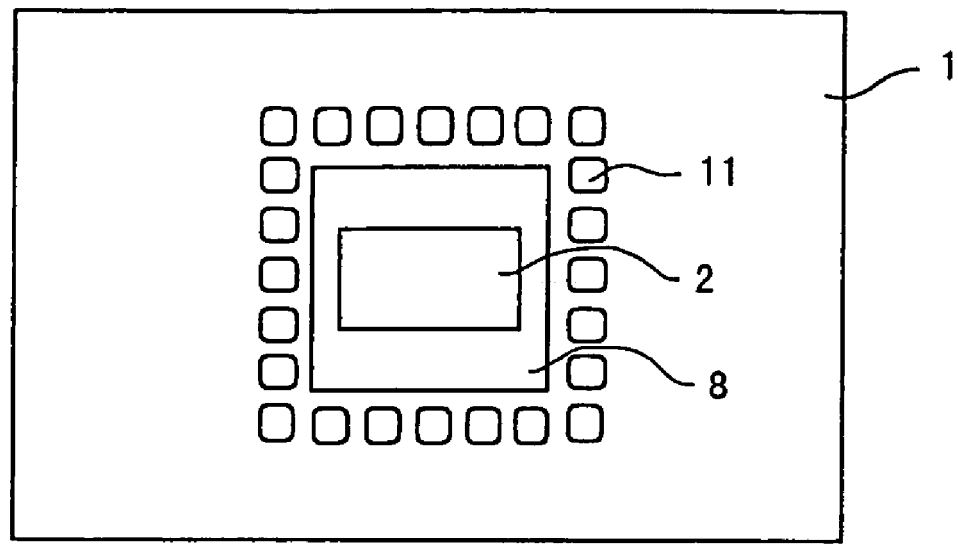
FIG. 11A is a top view of a dielectric substrate according to an Embodiment 5.
Figure 11B:
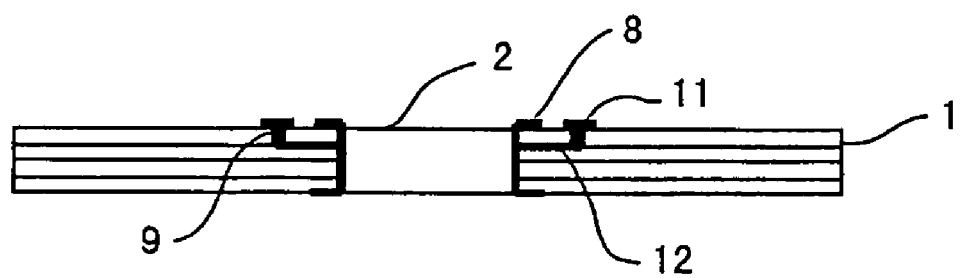
FIG. 11B is a vertical section of the dielectric substrate according to Embodiment 5.

FIG. 11A is a top view showing a dielectric substrate of the waveguide coupler according to a fifth embodiment of the present invention. FIG. 11B is a vertical section of the dielectric substrate. In these figures, components 11 and 12 are similar to those of Embodiment 4.

The dielectric substrate 1 includes the waveguide terminal 2 formed therein, and the GND surface 8 disposed on the substrate for conducting electricity to the grounded conductor of the waveguide terminal 2. The GND pattern 12 (see FIG. 11B) connected to the grounded conductor of the waveguide terminal 2 is formed in the internal layer of the dielectric substrate 1 and connected to the pads 11 for the ball-shaped, barrel-shaped, or cylindrical solders 7 via the through holes 9.

By providing the pads 11 connected to the grounded conductor of the waveguide terminal 2 through the internal layer of the multi-layered substrate, it is possible to set the positions of the ball-shaped, barrel-shaped, or cylindrical solders 7 accurately, while simplifying and reducing the cost of the connecting process of the waveguide terminal, as in Embodiment 2. It is also possible, as in Embodiment 3, to minimize the loss in the waveguide coupler by deriving and setting the parameters L1 and L2 (not shown herein) concerning the positions of the ball-shaped, barrel-shaped, or cylindrical solders 7.

A similar advantage can be obtained by forming the waveguide terminal in the dielectric substrate 1 by arranging the through holes in a rectangular shape, and disposing the GND pattern 12 of the internal layer which conducts electricity to the through holes, the through holes 9, and the pads 11.

Although the solders 7 described above are ball-shaped, barrel-shaped, or cylindrical, solders in other shapes, such as a plate, can provide similar advantages.

Thus, the fifth embodiment defines a still further aspect of the present invention, wherein at least one dielectric substrate is multi-layered, and includes a plurality of pads serving as contact regions which are formed on the surface of the dielectric substrate for conducting electricity to the grounded conductor of the waveguide terminal through the internal layer and the through holes of the dielectric substrate. With this configuration, the multiple pads for disposing the conductive joint members thereon are placed on the surface of the dielectric substrate at positions separated from the grounded conductive surface conducting electricity to the grounded conductor of the waveguide terminal. The pads are configured to conduct electricity to the grounded conductor of the waveguide terminal through the internal layer and the through holes of the multi-layered dielectric substrate. Thus, an accuracy of positioning the conductive joint members can be improved and, accordingly, the loss in the waveguide terminal is reduced.

Embodiment 6

Figure 12A:
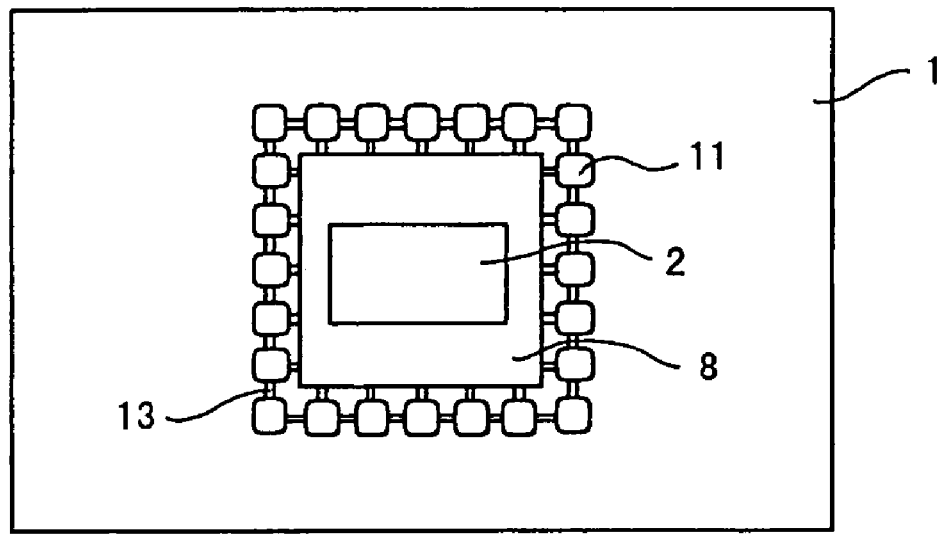
FIG. 12A is a top view of a dielectric substrate according to an Embodiment 6.
Figure 12B:
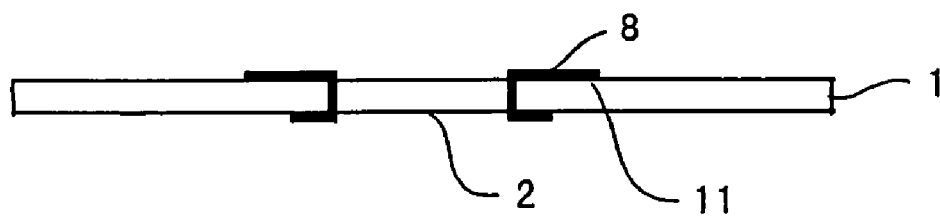
FIG. 12B is a vertical section of a single-layered dielectric substrate according to Embodiment 6.
Figure 12C:
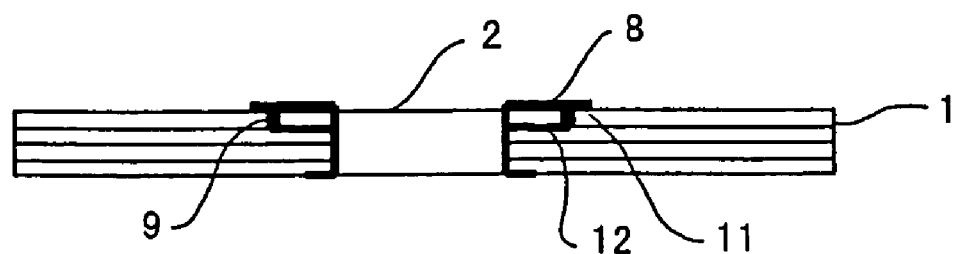
FIG. 12C is a vertical section of a multi-layered dielectric substrate according to Embodiment 6.

FIG. 12A is a top view showing a dielectric substrate of the waveguide terminal according to a sixth embodiment of the present invention. FIGS. 12B and 12C are vertical sections of the dielectric substrate. In these figures, components 1 to 12 are similar to those of Embodiment 5, and 13 indicates a connecting wire for connecting the GND surface 8 to the pads 11.

FIG. 12A is a top view of the dielectric substrate 1, FIG. 12B is a vertical section of a single-layered dielectric substrate 1, and FIG. 12C is a vertical section of a multi-layered dielectric substrate 1.

In FIGS. 12A and 12B, the dielectric substrate 1 includes the waveguide terminal 2 formed therein, and the GND surface 8 disposed on the surface of the substrate for conducting electricity to the grounded conductor of the waveguide terminal 2. The GND surface 8 is connected to the pads 11 for the ball-shaped, barrel-shaped, or cylindrical solders 7 via the connecting wire 13. The connecting wire 13 also connects between the multiple pads 11. With this configuration, it is possible to prevent the flow of solder into the GND surface 8 when the connecting wire 13 has a narrower width.

FIG. 12C shows a dielectric substrate 1 formed of a multi-layered substrate, wherein the GND surface 8 is connected to the grounded conductor of the waveguide terminal 2 via the GND pattern 12 formed in the internal layer of the dielectric substrate 1 and the through hole 9. The connecting wire 13 and the pads 11 are formed as shown in FIG. 12A and have similar functions.

By providing the pads 11 connected to the grounded conductor of the waveguide terminal 2 via the connecting wire 13, it is possible to set the positions of the ball-shaped, barrel-shaped, or cylindrical solders 7 accurately, while simplifying and reducing the cost of the connecting process of the waveguide terminal, as in Embodiment 2. It is also possible to minimize the loss in the waveguide:coupler by deriving and setting the parameters L1 and L2 (not shown herein) concerning the positions of the ball-shaped, barrel-shaped, or cylindrical solders 7 as in Embodiment 3.

A similar advantage can be provided by forming the waveguide terminal such that the through holes are arranged in a rectangular shape in the dielectric substrate 1 and that the GND surface 8 conducts electricity to the through holes, the connecting wire 13, and the pads 11.

Although the solders 7 described above are ball-shaped, barrel-shaped, or cylindrical, solders in other shapes, such as a plate, can provide similar advantages.

Thus, the sixth embodiment defines a still further aspect of the present invention, wherein at least one dielectric substrate includes the grounded conductive surface formed on the side of the substrate opposite to the other dielectric substrate for conducting electricity to the grounded conductor of the waveguide terminal, multiple pads formed on the same side of the substrate as the grounded conductive surface for serving as contact regions, and the connecting wire for electrically connecting each pad to the grounded conductive surface. With such a configuration, the multiple pads are disposed on the surface of the dielectric substrate at positions separated from the grounded conductive surface conducing electricity to the grounded conductor of the waveguide terminal, and the connecting wire is provided for connecting the pads to the grounded conductive surface. Thus, accuracy of positioning of the conductive joint members can be improved and, accordingly, the loss in the waveguide coupler can be reduced.

Embodiment 7

Figure 13A:
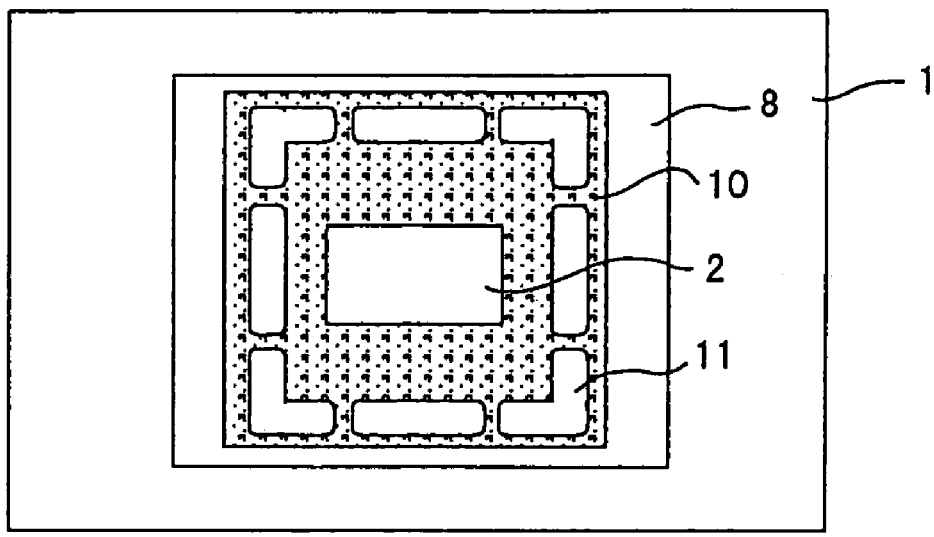
FIG. 13A is a top view of a dielectric substrate according to an Embodiment 7.
Figure 13B:
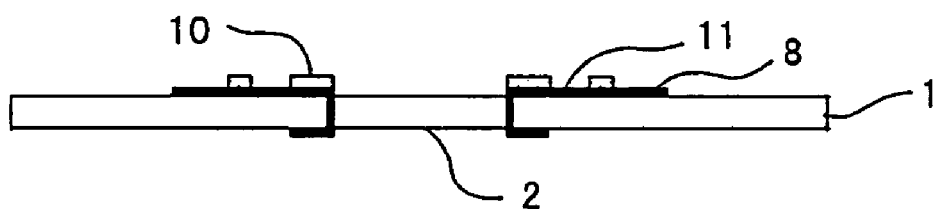
FIG. 13B is a vertical section of a single-layered dielectric substrate according to Embodiment 7.
Figure 13C:
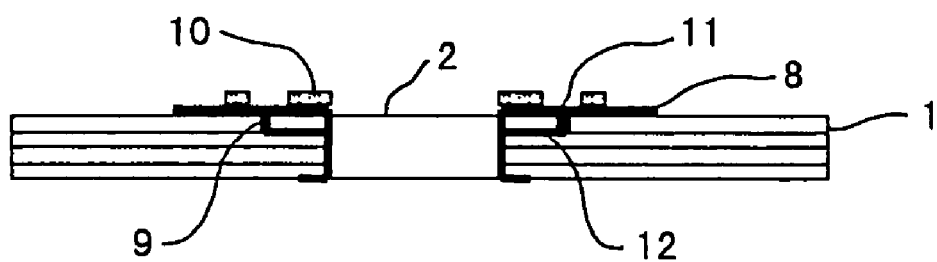
FIG. 13C is a vertical section of a multi-layered dielectric substrate according to Embodiment 7.

FIG. 13A is a top view showing a dielectric substrate of the waveguide coupler according to a seventh embodiment of the present invention. FIGS. 13B and 13C are vertical sections of the dielectric substrate. In these figures, components 1 to 12 are similar to those of Embodiment 4.

FIG. 13A is a top view of the dielectric substrate 1, FIG. 13B is a cross section of a single-layered dielectric substrate 1, and FIG. 13C is a cross section of a multi-layered dielectric substrate 1. In FIGS. 13A and 13B, the dielectric substrate 1 includes the waveguide terminal 2 formed therein and the GND surface 8 disposed on the surface of the substrate for conducting electricity to the grounded conductor of the waveguide terminal 2. The solder resist 10 is applied on a region of the GND surface 8 other than the regions where the pads 11 for disposing the ball-shaped, barrel-shaped, or cylindrical solders 7 are to be formed. Thus, the pads 11 to which the ball-shaped, barrel-shaped, or cylindrical solders 7 can be attached are formed on this region of the GND surface 8. The pads 11 are oblong so that multiple solders 7 can be disposed on one pad 11.

FIG. 13C shows the multi-layered dielectric substrate 1, wherein the GND surface 8 is connected to the grounded conductor of the waveguide terminal 2 via the GND pattern 12 formed in the internal layer of the dielectric substrate 1 and the through hole 9. The solder resist 10 and the pads 11 for disposing the ball-shaped, barrel-shaped, or cylindrical solders 7 are formed as shown in FIG. 13A.

By using the solder resist 10 to provide the pads 11 for the ball-shaped, barrel-shaped, or cylindrical solders 7, it is possible to set the positions of the ball-shaped, barrel-shaped, or cylindrical solders 7 accurately, while, as in Embodiment 2, simplifying and reducing the cost of the connecting process of the waveguide terminals. It is also possible, as in Embodiment 3, to minimize the loss in the waveguide coupler by deriving and setting the parameters L1 and L2 concerning the positions of the ball-shaped, barrel-shaped, or cylindrical solders 7.

Although the pads 11 are oblong in the figures, pads 11 can be formed so as to surround the circumference of the waveguide 2 to provide a similar advantage.

A similar advantage can also be provided even when adjacent ball-shaped, barrel-shaped, or cylindrical solders 7 melt together and merge after soldering.

Although the solders 7 described above are ball-shaped, barrel-shaped, or cylindrical, solders in other shapes, such as a plate, can provide similar advantages.

Also, a similar advantage can be provided by forming the waveguide coupler by arranging the through holes in a rectangular shape in the dielectric substrate, and disposing the GND surface 8 so as to conduct electricity to the through holes.

Embodiment 8

Figure 14A:
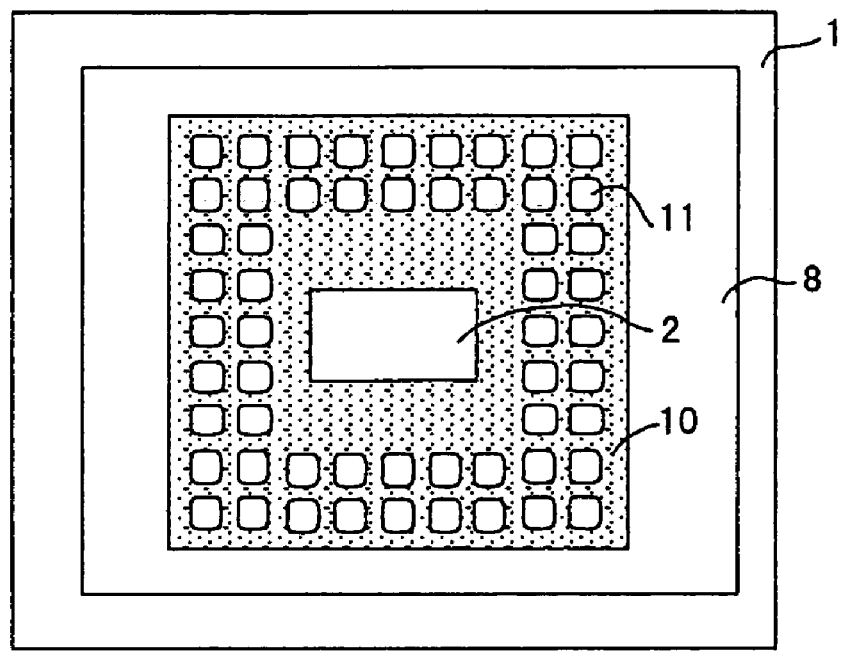
FIG. 14A is a top view of a dielectric substrate according to an Embodiment 8.
Figure 14B:
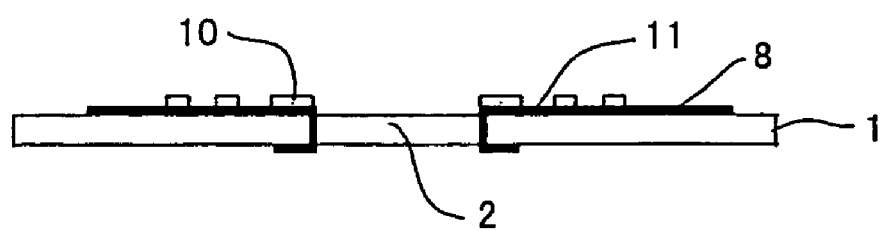
FIG. 14B is a vertical section of the dielectric substrate according to Embodiment 8.

FIG. 14A is a top view showing a dielectric substrate of the waveguide coupler according to an eighth embodiment of the present invention. FIG. 14B is a vertical section of the dielectric substrate. In these figures, 1 to 11 are similar to those of Embodiment 4.

Figure 15:
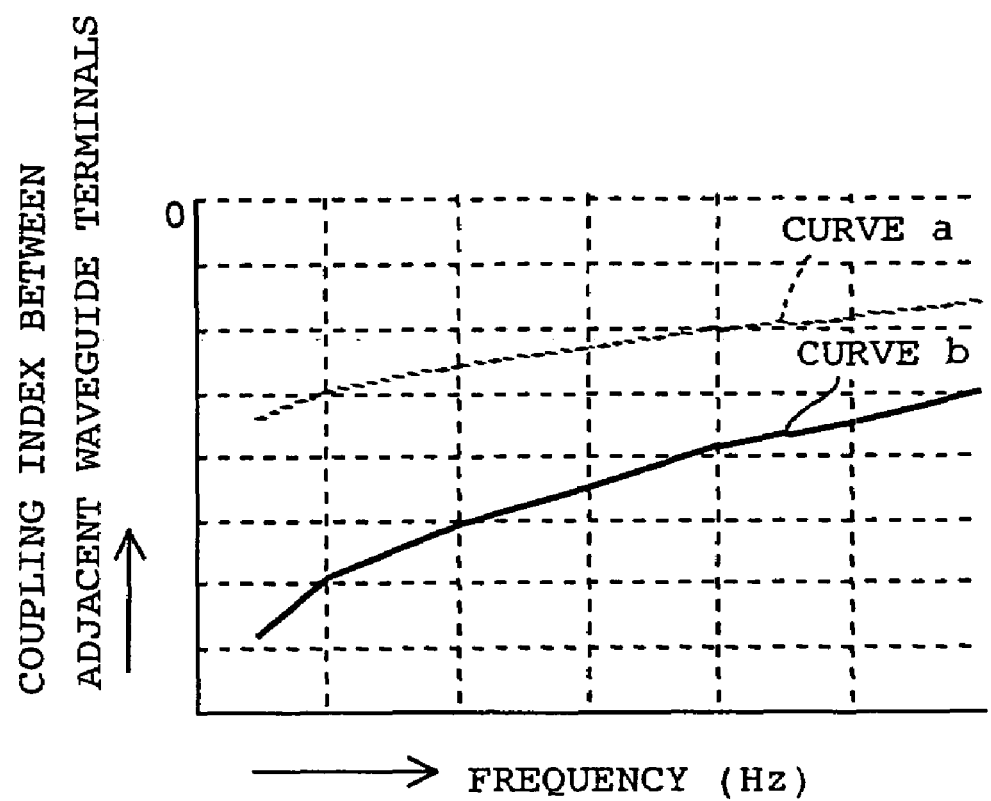
FIG. 15 is a graph showing the characteristic of the waveguide coupler according to Embodiment 8.

FIG. 15 is a graph showing the coupling index of a high frequency signal between the waveguide terminal shown in FIG. 14A and its adjacent waveguide terminal. The adjacent waveguide terminal is disposed, although not shown, externally to the ball-shaped, barrel-shaped, or cylindrical solders 7 arranged in rows around the circumference of the waveguide terminal shown in FIG. 14A.

The dielectric substrate 1 includes the waveguide terminal 2 formed therein, and the GND surface 8 disposed on the surface of the substrate for conducting electricity to the grounded conductor of the waveguide terminal 2. The solder resist 10 is applied on a region of the GND surface 8 other than the regions where the pads 11 for disposing the ball-shaped, barrel-shaped, or cylindrical solders 7 are-to be formed. Thus, the pads 11 for disposing the ball-shaped, barrel-shaped, or cylindrical solders 7 are formed on this region of the GND surface 8. Herein, the pads 11 are formed in double rows around and parallel with the sides of the rectangular waveguide terminal 2 so as to provide two rows of the ball-shaped, barrel-shaped, or cylindrical solders 7.

In FIG. 15, a curve a represents the coupling index of a high frequency signal between adjacent waveguide terminals when the ball-shaped, barrel-shaped, or cylindrical solders 7 are arranged in a single row around the waveguide terminal 2, while a curve b represents the coupling index when the solders are arranged in double rows. As indicated in the graph, by providing the ball-shaped, barrel-shaped, or cylindrical solders 7 in multiple rows, it is possible to suppress the coupling index between adjacent waveguide terminals, which is especially advantageous if, for example, more than one waveguide terminals 2 are provided.

By providing the ball-shaped, barrel-shaped, or cylindrical solders 7 in multiple rows, it is possible to suppress the coupling index between adjacent waveguide terminals, while, as in Embodiment 4, setting the positions of the ball-shaped, barrel-shaped, or cylindrical solders 7 accurately as well as simplifying and reducing the cost of the connecting process of the waveguide terminal. It is also possible to minimize the loss in the waveguide coupler, as in Embodiment 3, by deriving and setting the parameters L1 and L2 concerning the positions of the ball-shaped, barrel-shaped, or cylindrical solders 7.

A similar advantage can be provided by forming the waveguide terminal by arranging the through holes in a rectangular shape in the dielectric substrate 1, and disposing the GND surface 8 so as to conduct electricity to the through holes.

Although the solders 7 described above are ball-shaped, barrel-shaped, or cylindrical, solders in other shapes, such as a plate, can provide similar advantages.

Thus, the eighth embodiment defines a still another aspect of the present invention, wherein at least one dielectric substrate forming the waveguide coupler includes multiple conductive joint members arranged in rows running parallel to the sides of the rectangular waveguide terminal, with several rows each being disposed for each side of the waveguide terminal. With this configuration, it is possible to suppress the coupling index between adjacent waveguide terminals.

Embodiment 9

Figure 16A:
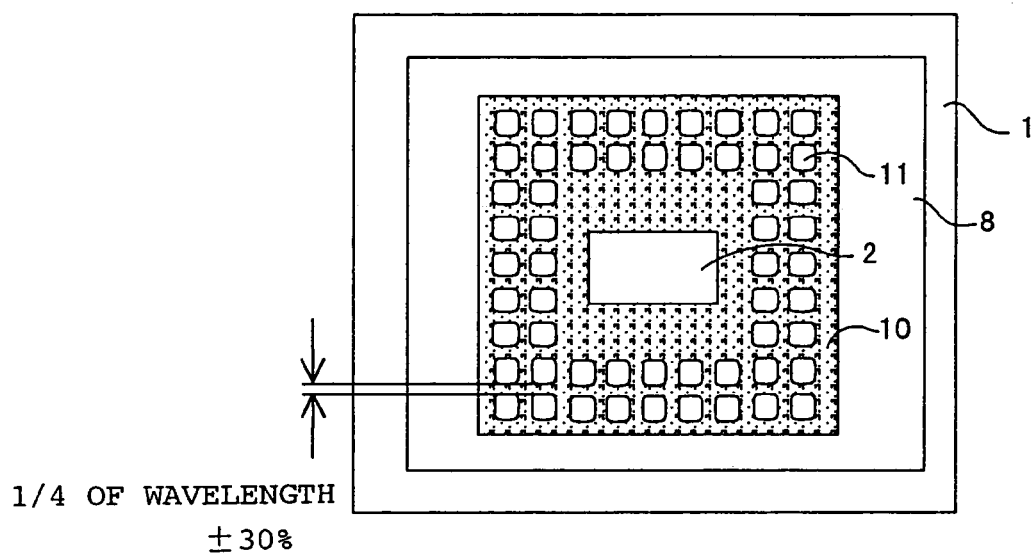
FIG. 16A is a top view of a dielectric substrate according to an Embodiment 9.
Figure 16B:
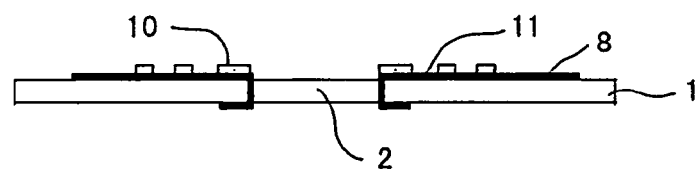
FIG. 16B is a vertical section of the dielectric substrate according to Embodiment 9.

FIG. 16A is a top view showing a dielectric substrate of the waveguide coupler according to a ninth embodiment of the present invention. FIG. 16B is a vertical section of the dielectric substrate. In these figures, components 1 to 11 are similar to those of Embodiment 8.

Figure 17:
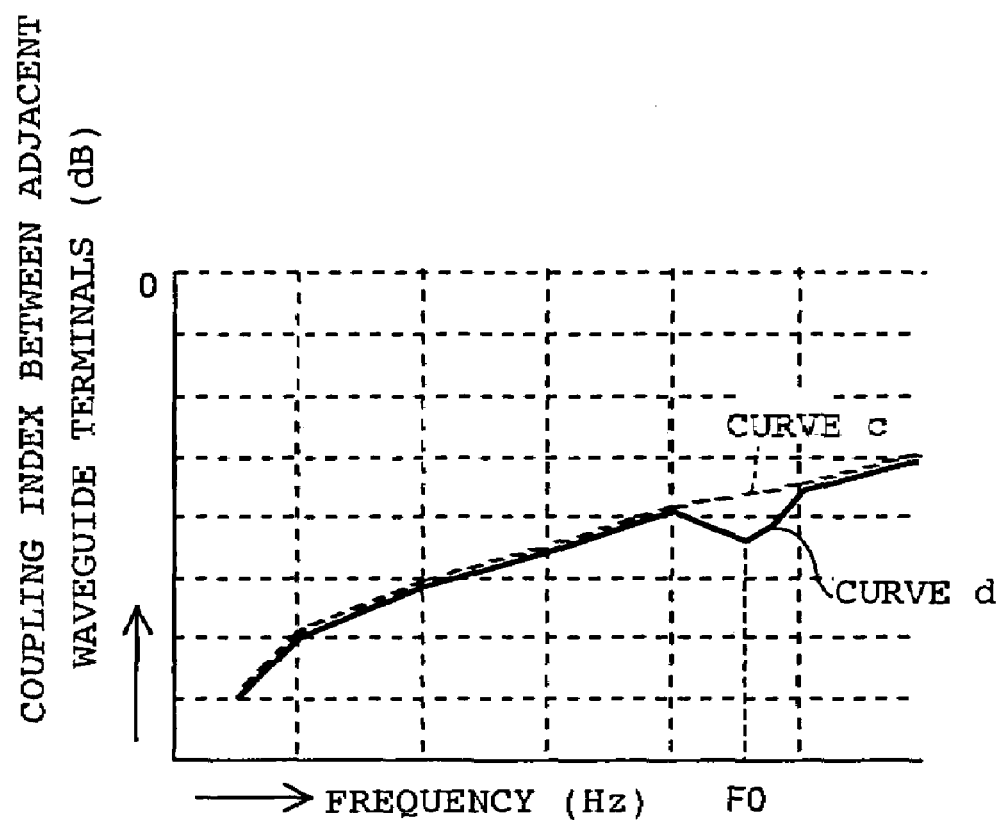
FIG. 17 is a graph showing the characteristic of the waveguide coupler according to Embodiment 9.

FIG. 17 is a graph showing the coupling index of a high frequency signal between the waveguide terminal shown in FIG. 16A and its adjacent waveguide terminal. Although not shown in the figure, the adjacent waveguide terminal is disposed externally to the ball-shaped, barrel-shaped, or cylindrical solders 7 arranged in rows around the waveguide terminal 2 shown in FIG. 16A.

The dielectric substrate 1, the waveguide terminal 2, the GND surface 8, the solder resist 10, and the pads 11 are formed in a similar manner to those of Embodiment 8. The pads 11 and the ball-shaped, barrel-shaped, or cylindrical solders 7 are formed in double rows around and parallel with the sides of the rectangular waveguide terminal 2, wherein a gap between the rows is set in the range of ±30% of the ¼ wavelength of a high frequency signal. (assuming its frequency to be F0) passing through the waveguide terminal 2.

In FIG. 17, a curve c represents the coupling index of a high frequency signal between adjacent waveguide terminals when the ball-shaped, barrel-shaped, or cylindrical solders 7 are arranged on the circumference of the waveguide terminals in two rows with a certain gap provided between them, while a curve d represents the coupling index when the gap is set in the range of ±30% of the ¼ wavelength of a high frequency signal (assuming its frequency to be F0) passing through the waveguide terminal 2. By setting the gap between the ball-shaped, barrel-shaped, or cylindrical solders 7 in the range of ±30% of the ¼ wavelength of the high frequency signal passing through the waveguide terminal 2, it is possible to further suppress the coupling index between adjacent waveguide terminals only in the frequency band of the high frequency signal. This is advantageous when, for example, several waveguide terminals 2 are provided.

By arranging the ball-shaped, barrel-shaped, or cylindrical solders 7 in several rows with a gap between the rows in the range of ±30% of the ¼ wavelength of the high frequency signal passing through the waveguide terminal 2, it is possible to suppress the coupling index between adjacent waveguide terminals, while, as in Embodiment 4, setting the positions of the ball-shaped, barrel-shaped, or cylindrical solders 7 accurately as well as simplifying and reducing the cost of the connecting process of the waveguide terminals. It is also possible to minimize the loss in the waveguide coupler by deriving and setting the parameters L1 and L2 (not shown herein) concerning the positions of the ball-shaped, barrel-shaped, or cylindrical solders 7.

A similar advantage can be provided by forming the waveguide terminal by arranging the through holes in a rectangular shape, and disposing the GND surface 8 so as to conduct electricity to the through holes.

Although the solders 7 are ball-shaped, barrel-shaped, or cylindrical in the above description, they can be in other shapes, such as a plate, to provide a similar advantage.

Embodiment 10

Figure 18A:
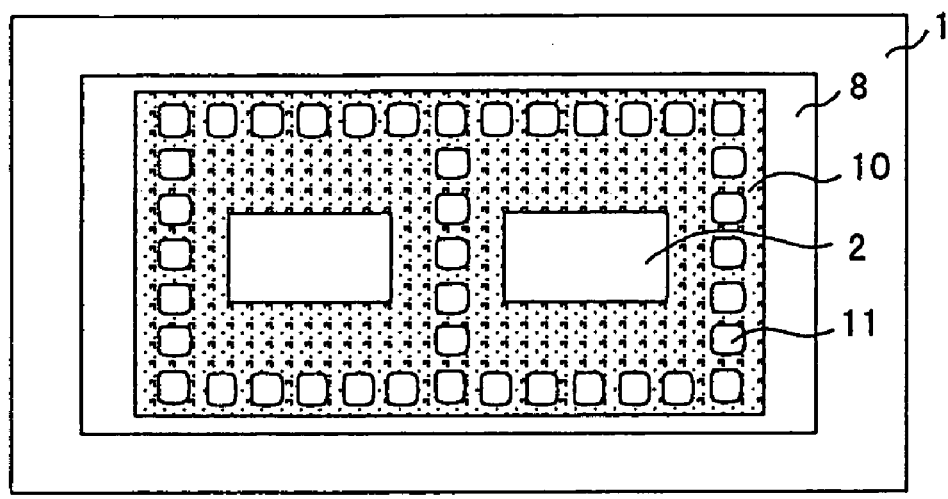
FIG. 18A is a top view of a dielectric substrate according to an Embodiment 10.
Figure 18B:
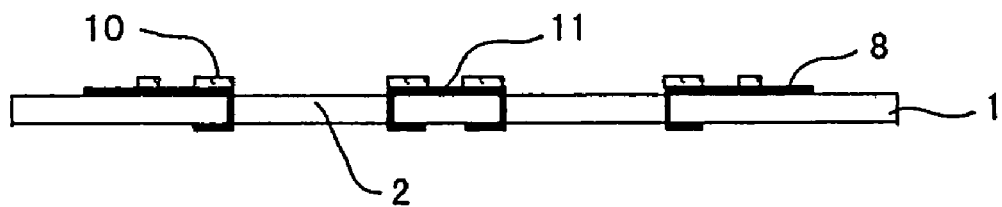
FIG. 18B is a vertical section of the dielectric substrate according to Embodiment 10.

FIG. 18A is a top view of a dielectric substrate of the waveguide coupler according to a tenth embodiment of the present invention. FIG. 18B is a vertical section of the dielectric substrate. In these figures, components 1 to 11 are similar to those of Embodiment 4.

The dielectric substrate 1 includes two waveguide terminals 2 formed therein, and the GND surface 8 disposed on the substrate for conducting electricity to the grounded conductors of the two waveguide terminals 2. The solder resist 10 is applied on a region of the GND surface 8 other than the regions where the pads 11 for disposing the ball-shaped, barrel-shaped, or cylindrical solders 7 are to be formed. Thus, the pads 11 to which the ball-shaped, barrel-shaped, or cylindrical solders 7 can be attached are formed on this region of the GND surface 8. Herein, the pads 11 are also provided around and between the two waveguide terminals.

By arranging more than one waveguide terminals 2 adjacent to each other and disposing the ball-shaped, barrel-shaped, or cylindrical solders 7 around and between the waveguide terminals 2, it is possible to provide several waveguide terminals 2 in a small space, while setting the positions of the ball-shaped, barrel-shaped, or cylindrical solders 7 accurately as well as simplifying and reducing the cost of the connecting process of the waveguide terminals as in Embodiment 4. It is also possible, as in Embodiment 3, to minimize the loss in the waveguide coupler by, deriving and setting the parameters L1 and L2 (not shown herein) concerning the positions of the ball-shaped, barrel-shaped, or cylindrical solders 7.

A similar advantage can be provided by forming the waveguide terminals by arranging the through holes in a rectangular shape in the dielectric substrate 1, and disposing the GND surface 8 so, as to conduct electricity to the through holes.

Although the solders 7 described above are ball-shaped, barrel-shaped, or cylindrical, solders in other shapes, such as a plate, can provide similar advantages.

Embodiment 10 defines a still further aspect of the present invention, wherein at least one dielectric substrate includes two or more waveguide terminals formed therein, and the contact regions are disposed on the circumference of each waveguide terminal so as to correspond to the opposing sides of adjacent rectangular waveguide terminals. Thus, the contact regions are shared by the adjacent waveguide terminals. With this configuration, it is possible to provide several waveguide terminals in a small space.

Embodiment 11

Figure 19A:
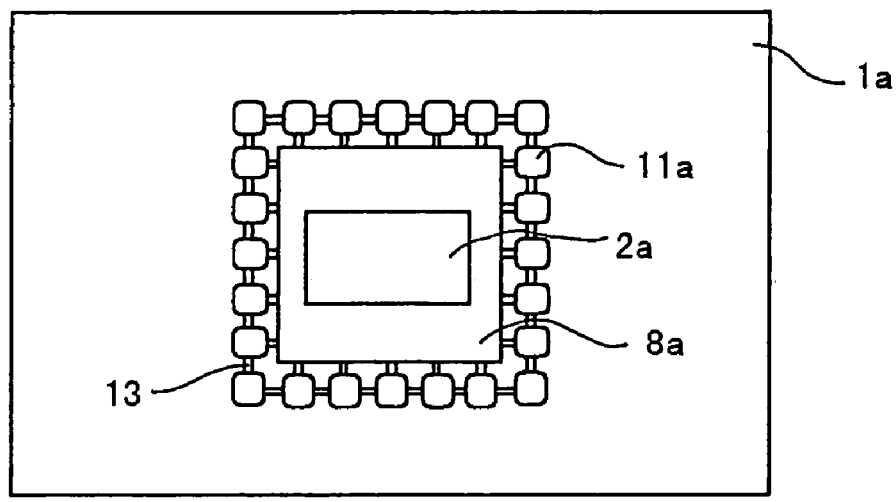
FIG. 19A is a top view of the first dielectric substrate which forms a waveguide coupler according to an Embodiment 11.
Figure 19B:
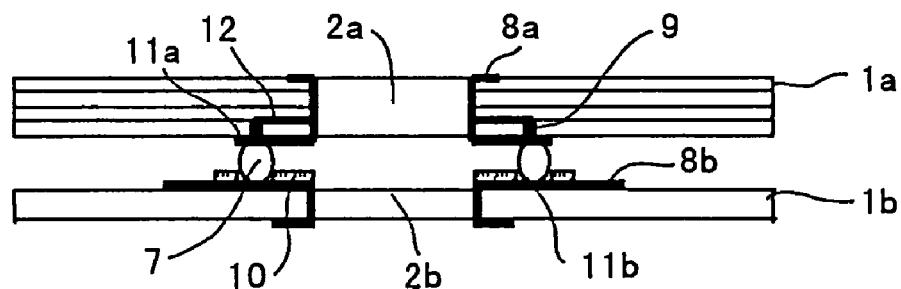
FIG. 19B is a vertical section of the waveguide coupler according to Embodiment 11.
Figure 19C:
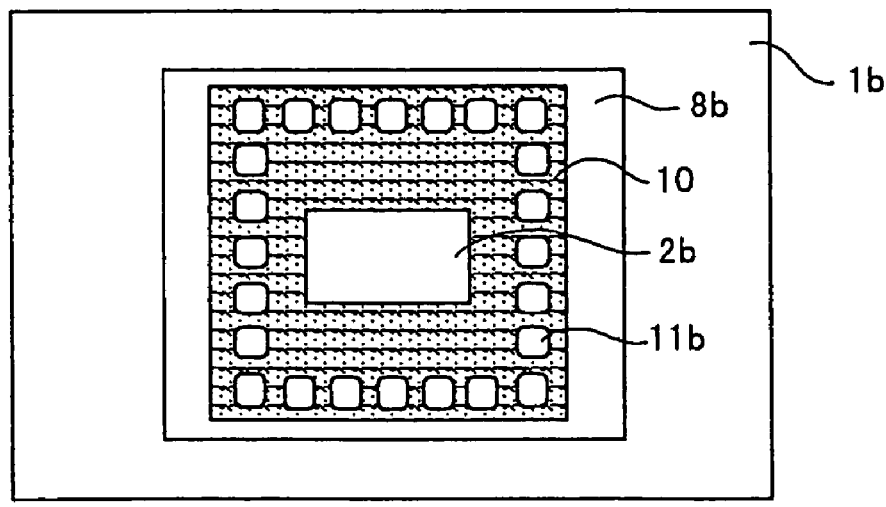
FIG. 19C is a top view of the second dielectric substrate which forms the waveguide coupler according to Embodiment 11.

FIGS. 19A and 19C are top views of two types of dielectric substrates of the waveguide coupler according to an eleventh embodiment of the present invention. FIG. 19B is a vertical section of the waveguide coupler where the two types of dielectric substrates are joined. In these figures, components 1 to 13 are similar to those of Embodiments 4 and 6.

The dielectric substrate 1a of FIG. 19A is an upper substrate of the section shown in FIG. 19B, which includes the waveguide terminal 2a formed therein and the GND surface 8a disposed on the surface of the substrate for conducting electricity to the grounded conductor of the waveguide terminal 2a. The GND surface 8a of FIG. 19A is connected via the connecting wire 13 to the pads 11a for the ball-shaped, barrel-shaped, or cylindrical solders 7 disposed on the surface of the dielectric substrate 1a. The connecting wire 13 also connects between the multiple pads 11. The GND surface 8a is connected to the grounded conductor of the waveguide terminal 2a via the GND pattern 12 (see FIG. 19B) formed in the internal layer of the dielectric substrate 1a and the through holes 9.

The dielectric substrate 1b of FIG. 19C is a lower substrate of the section shown in FIG. 19B, which includes the waveguide terminal 2b formed therein and the GND surface 8b disposed on the substrate for conducting electricity to the grounded conductor of the waveguide terminal 2b. The solder resist 10 of FIG. 19C is applied on a region of the GND surface 8b other than the regions where the pads 11b for disposing the ball-shaped, barrel-shaped, or cylindrical solders 7 are to be formed. Thus, the pads 11b to which the ball-shaped, barrel-shaped, or cylindrical solders 7 (see FIG. 19B) can be attached are formed on this region of the GND surface 8b.

The two dielectric substrates 1a and 1b are disposed so that the pads 11a and 11b oppose each other. After that the ball-shaped, barrel-shaped, or cylindrical solders 7 are provided to connect between the waveguide terminals 2a and 2b by soldering.

With this configuration, it is possible to set the positions of the ball-shaped, barrel-shaped, or cylindrical solders 7 accurately, while, as in Embodiment 2, simplifying and reducing the cost of the connecting process of the waveguide terminals. It is also possible, as in Embodiment 3, to reduce the loss in the waveguide coupler by deriving and setting the parameters L1 and L2 concerning the positions of the ball-shaped, barrel-shaped, or cylindrical solders 7.

Although the solders 7 described above are ball-shaped, barrel-shaped, or cylindrical, solders in other shapes, such as a plate, can provide similar advantages.

Embodiment 12

Figure 20A:
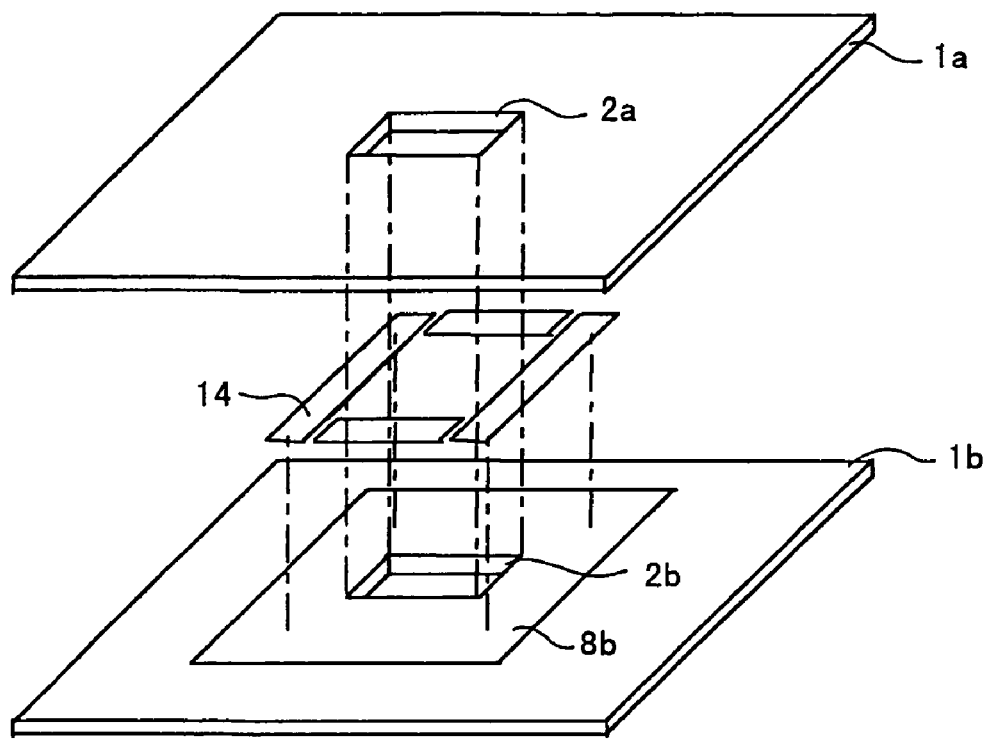
FIG. 20A is an exploded perspective view of a waveguide coupler according to an Embodiment 12.
Figure 20B:
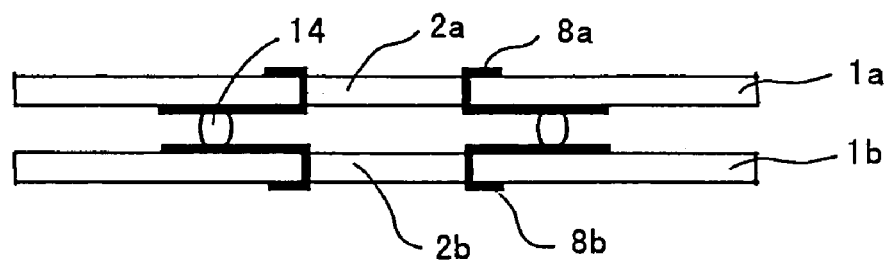
FIG. 20B is a vertical section of the waveguide coupler according to Embodiment 12.

FIG. 20A is an exploded perspective view of a waveguide coupler according to a twelfth embodiment of the present invention. FIG. 20B is a vertical section of the waveguide coupler. In these figures, 1a, 1b, 2a, 2b, 8a, and 8c are similar to those of Embodiment 1, and 14 indicates an electrically conductive adhesive.

The waveguide coupler will be described. In these figures, each dielectric substrate 1a, 1b includes the waveguide terminal 2a, 2b formed therein, and the GND surface 8a, 8b disposed on the surface of the substrate for conducting electricity to the grounded conductor of the waveguide terminal 2a, 2b. The two dielectric substrates 1a and 1b are disposed in a manner that the GND surfaces 8a and 8b oppose each other. The two dielectric substrates 1a and 1b are bonded together by the conductive adhesive 14 sandwiched between the GND surfaces 8a and 8b, whereby the waveguide terminals are connected. The conductive adhesive 14 is disposed to surround the circumference of both waveguide terminals 2a, 2b.

A similar configuration can be realized by forming the dielectric substrates 1a and 1b shown in FIG. 20A of multi-layered substrates.

By bonding the waveguide terminals formed in the dielectric substrates with the electrically conductive adhesive, it is possible, as in Embodiment 1, to simplify the connecting process of the waveguide terminals, which has conventionally been manually fastened with screws. It is also possible to reduce the cost, because expensive parts, such as a waveguide adapter or carriers, may be eliminated.

Embodiment 13

Figure 21A:
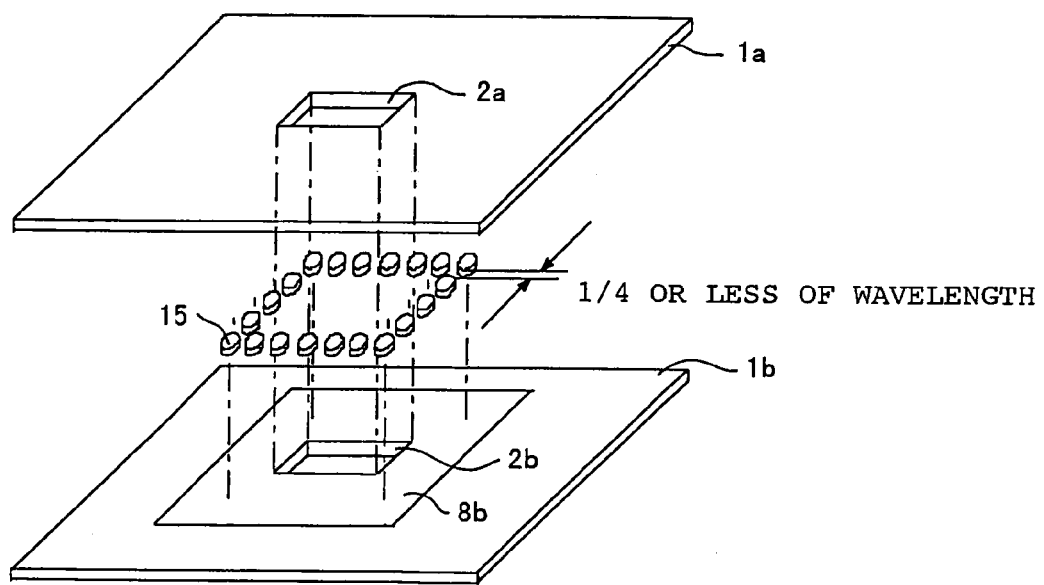
FIG. 21A is an exploded perspective view of a waveguide coupler according to an Embodiment 13.
Figure 21B:
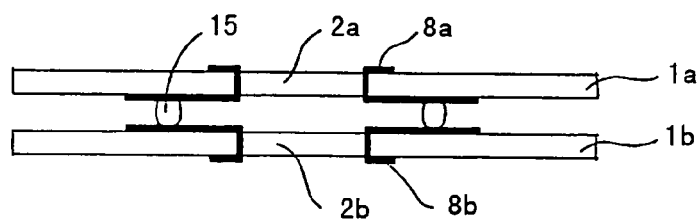
FIG. 21B is a vertical section of the waveguide coupler according to Embodiment 13.

FIG. 21A is an exploded perspective view of a waveguide coupler according to a thirteenth embodiment of the present invention. FIG. 21B is a vertical section of the waveguide coupler. In these FIGS. 1a, 1b, 2a, 2b, 8a, and 8b are similar to those of Embodiment 1, and 15 indicates ball-shaped, barrel-shaped, or cylindrical pieces of metal.

The waveguide coupler will be described. In these figures, the dielectric substrates 1a and 1b, the waveguide terminals 2a and 2b, and the GND surfaces 8a and 8b are arranged similarly to those of Embodiment 1 and have similar functions. A plurality of ball-shaped, barrel-shaped, or cylindrical pieces of metal 15, such as gold, are arranged between the GND surfaces 8a and 8b so as to surround the circumference of the waveguide terminals 2a and 2b. The ball-shaped, barrel-shaped, or cylindrical pieces of metal 15 are arranged in a row in a manner that a gap between adjacent metal pieces 15 is equal to, or less than ¼ of the wavelength of a high frequency signal passing through the waveguide terminals 2a and 2b. When the two dielectric substrates 1a and 1b are connected by thermocompression bonding, the waveguide terminals 2a and 2b formed in the dielectric substrates 1a and 1b are joined via the metal pieces 15.

By connecting the waveguide terminals formed in the dielectric substrates by thermocompression bonding, it is possible, as in Embodiment 1, to simplify the connecting process of the waveguide terminals, which has conventionally been fastened manually with screws. It is also possible to reduce the cost of the device because expensive parts, such as a waveguide coupler or carriers, may be eliminated. Also, as in Embodiment 3, it is possible to minimize the loss in the waveguide coupler by deriving and setting the parameters L1 and L2 concerning the positions of the ball-shaped, barrel-shaped, or cylindrical metal pieces 15.

Forming the dielectric substrates 1a and 1b of multi-layered substrates can provide a similar advantage.

A similar advantage can also be provided by forming the waveguide terminals in the dielectric substrates by arranging the through holes in a rectangular shape, and disposing the GND surfaces 8 for conducting electricity to the through holes.

Figure 22:
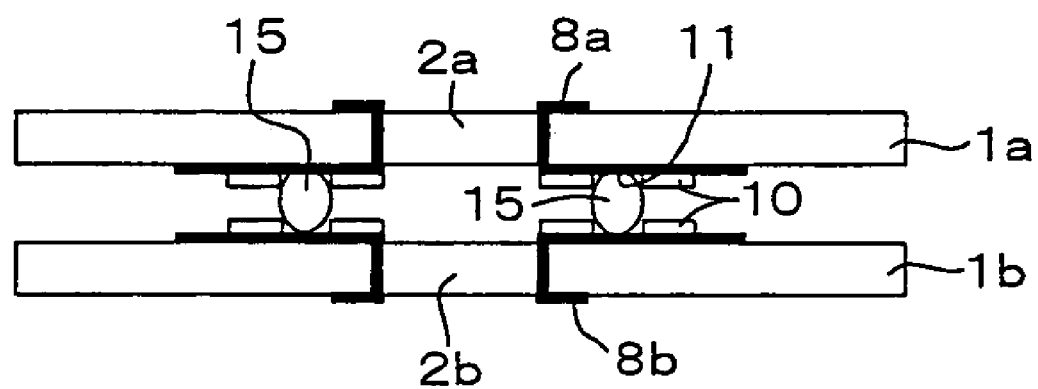
FIG. 22 is a vertical section of a modified example of the waveguide coupler according to the Embodiment 13.

FIG. 22 is a vertical section of a modified example of this embodiment in which 2a, 2b are waveguide terminals, 8a is the GND surface and 15 indicates ball-shaped, barrel-shaped or cylindrical pieces of metal, wherein the waveguide coupler uses the dielectric substrates 1a, 1b having the pads 11 formed by the solder resist 10 as shown in FIG. 10A. Herein, the metal pieces 15 are fused to the pads 11 on which no solder resist is applied.

What is claimed is:

1. A waveguide coupler, comprising:
waveguide terminals arranged in a rectangular shape and formed in a glass epoxy substrate and a ceramic substrate arranged opposite to each other, wherein
each of said substrates includes a contact region which conducts electricity to a grounded conductor of said waveguide terminals, one said contact region being arranged to surround said waveguide terminals at a position opposite to the other said contact region when both said waveguide terminals are connected together,
said substrates are joined together with a plurality of electrically conductive joint members arranged in an array shaped like a rectangle surrounding said waveguide terminals between said opposing contact regions, and
said waveguide terminal of said ceramic substrate is formed by a plurality of hollow through holes arranged in a rectangular shape facing said waveguide terminal of said ceramic substrate inside the array of said plurality of electrically conductive joint members.

2. A waveguide coupler, comprising:
waveguide terminals arranged in a rectangular shape and formed in a glass epoxy substrate and a ceramic substrate arranged opposite to each other, wherein
each of said substrates includes a contact region which conducts electricity to a grounded conductor of said waveguide terminals, one said contact region being arranged to surround said waveguide terminals at a position opposite to the other said contact region when both said waveguide terminals are connected together,
said substrates are joined together with a plurality of electrically conductive joint members arranged in plural arrays each shaped like a rectangle surrounding said waveguide terminals between said opposing contact regions, and
said waveguide terminal of said ceramic substrate is formed by a plurality of through holes arranged in a rectangular shape facing said waveguide terminal of said ceramic substrate inside the array of said plurality of electrically conductive joint members,
said conductive joint members placed on an outer array are connected to an electrical terminal connected to a high-frequency circuit on said ceramic substrate and to an electrode on said glass epoxy substrate, so that said high-frequency circuit is electrically connected to an external circuit via said conductive joint member placed on said outer array.

3. The waveguide coupler according to claim 1,
wherein the plurality of electrically conductive joint members are formed of ball-shaped, barrel-shaped, or cylindrical solder, and
said two substrates are joined together by soldering.

4. The waveguide coupler according to claim 1,
wherein said waveguide terminal of said ceramic substrate is connected to a high-frequency circuit mounted on said ceramic substrate,
the plurality of said electrically conductive joint members are arranged in plural arrays, and
said plurality of conductive joint members placed on an outer array are connected to an electrical terminal connected to said high-frequency circuit on said ceramic substrate and to an electrode on said glass epoxy substrate, so that said high-frequency circuit is electrically connected to an external circuit via said conductive joint member placed on said outer array.

5. A waveguide coupler, comprising:

waveguide terminals arranged in a rectangular shape and formed in a glass epoxy substrate and a ceramic substrate arranged opposite to each other, wherein each of said substrates includes a contact region which conducts electricity to a grounded conductor of said waveguide terminals, one said contact region being arranged to surround said waveguide terminals at a position opposite to the other said contact region when both said waveguide terminals are connected together, said substrates are joined together with a plurality of electrically conductive joint members arranged in an array shaped like a rectangle surrounding said waveguide terminals between said opposing contact regions, and said waveguide terminal of said ceramic substrate is formed by a plurality of through holes arranged in a rectangular shape facing said waveguide terminal of said ceramic substrate inside the array of said plurality of electrically conductive joint members, said grounded conductor of said waveguide terminal of said ceramic substrate disposed so as to conduct electricity to the through holes.

* * * * *

UNITED STATES PATENT AND TRADEMARK OFFICE
CERTIFICATE OF CORRECTION

PATENT NO.       : 7,705,697 B2                                Page 1 of 1
APPLICATION NO.  : 11/637713
DATED            : April 27, 2010
INVENTOR(S)      : Tsutomu Tamaki It is certified that error appears in the above-identified patent and that said Letters Patent is hereby corrected as shown below:

Claim 1, column 18, line 21, delete "hollow".

Signed and Sealed this

Twenty-fourth Day of August, 2010

David J. Kappos
*Director of the United States Patent and Trademark Office*